United States Patent
Yoshino et al.

(10) Patent No.: US 12,312,499 B2
(45) Date of Patent: May 27, 2025

(54) SURFACE TREATMENT METHOD, METHOD FOR PRODUCING SEMICONDUCTOR SUBSTRATE INCLUDING THE SURFACE TREATMENT METHOD, COMPOSITION FOR SURFACE TREATMENT, AND SYSTEM FOR PRODUCING SEMICONDUCTOR SUBSTRATE INCLUDING THE COMPOSITION FOR SURFACE TREATMENT

(71) Applicant: Fujimi Incorporated, Kiyosu (JP)

(72) Inventors: Tsutomu Yoshino, Kiyosu (JP); Yasuto Ishida, Kiyosu (JP)

(73) Assignee: FUJIMI INCORPORATED, Kiyosu (JP)

( * ) Notice: Subject to any disclaimer, the term of this patent is extended or adjusted under 35 U.S.C. 154(b) by 281 days.

(21) Appl. No.: 17/881,388

(22) Filed: Aug. 4, 2022

(65) Prior Publication Data
US 2023/0048722 A1 Feb. 16, 2023

(30) Foreign Application Priority Data

Aug. 5, 2021 (JP) .............................. 2021-129173
May 11, 2022 (JP) .............................. 2022-078423

(51) Int. Cl.
- C09G 1/02 (2006.01)
- B24B 37/04 (2012.01)
- C09K 3/14 (2006.01)
- H01L 21/3105 (2006.01)

(52) U.S. Cl.
CPC ............... *C09G 1/02* (2013.01); *B24B 37/04* (2013.01); *C09K 3/1436* (2013.01); *H01L 21/31053* (2013.01)

(58) Field of Classification Search
CPC ........... C09G 1/02; B24B 37/04; B24B 37/24; B24B 55/06; C09K 3/1436; C09K 3/1409; C09K 3/1454; H01L 21/31053; H01L 21/02065; H01L 21/67219; C11D 3/37; C11D 1/02; C11D 3/0047; C11D 3/3757; C11D 2111/22
USPC ................................................... 438/690–693
See application file for complete search history.

(56) References Cited

U.S. PATENT DOCUMENTS

| | | | |
|---|---|---|---|
| 6,705,934 B1 * | 3/2004 | Shiro ..................... | B24B 37/24 451/526 |
| 2006/0060569 A1 * | 3/2006 | Tano ...................... | B24B 37/24 216/88 |
| 2013/0174867 A1 | 7/2013 | Harada et al. | |

FOREIGN PATENT DOCUMENTS

JP    2012-074678 A    4/2012

OTHER PUBLICATIONS

Translation of WO 2012029814A1 (Year: 2012).*

* cited by examiner

*Primary Examiner* — Duy Vu N Deo
(74) *Attorney, Agent, or Firm* — Foley & Lardner LLP

(57) ABSTRACT

The present invention provides a unit that can sufficiently remove a residue containing inorganic oxide abrasive grains present on the surface of a polished object to be polished containing silicon oxide. One aspect of the present invention relates to a surface treatment method for reducing a residue containing inorganic oxide abrasive grains on a surface of a polished object to be polished containing silicon oxide using a composition for surface treatment, wherein the composition for surface treatment contains a zeta potential adjusting agent having an sp value of more than 9 and 11 or less and having a negatively charged functional group and a dispersing medium, and the surface treatment method includes negatively controlling a zeta potential of the silicon oxide and controlling a zeta potential of the inorganic oxide abrasive grains to −30 mV or less using the surface treatment composition.

13 Claims, No Drawings

SURFACE TREATMENT METHOD, METHOD FOR PRODUCING SEMICONDUCTOR SUBSTRATE INCLUDING THE SURFACE TREATMENT METHOD, COMPOSITION FOR SURFACE TREATMENT, AND SYSTEM FOR PRODUCING SEMICONDUCTOR SUBSTRATE INCLUDING THE COMPOSITION FOR SURFACE TREATMENT

CROSS-REFERENCE

The present application is based on Japanese Patent Application No. 2021-129117 filed on Aug. 5, 2021 and Japanese Patent Application No. 2022-78423 filed on May 11, 2022, the disclosures of which are incorporated herein by reference in their entirety.

TECHNICAL FIELD

The present invention relates to a surface treatment method, a method for producing a semiconductor substrate including the surface treatment method, a composition for surface treatment, and a system for producing a semiconductor substrate including the composition for surface treatment.

BACKGROUND ART

In recent years, with adoption of multi-layer wiring on the surface of a semiconductor substrate, when producing a device, the so-called Chemical Mechanical Polishing (CMP) technique, in which a semiconductor substrate is polished and flattened, has been used. CMP is a method for flattening the surface of an object to be polished (material to be polished) such as a semiconductor substrate using a polishing composition (slurry) that contains abrasive grains such as silica, alumina, and ceria, an additive such as an anticorrosive and a surfactant, and the like. Examples of the object to be polished (material to be polished) include silicon, polysilicon, a silicon oxide film (silicon oxide), silicon nitride, or the like, a wiring made of a metal or the like, and a plug.

A large amount of an impurity (also referred to as a foreign substance or a residue) remains on the surface of the semiconductor substrate after the CMP step. Examples of the foreign substance include abrasive grains derived from the polishing composition used in CMP, an anticorrosive, an organic substance such as a surfactant, and a silicon-containing material generated by polishing the silicon-containing material that is an object to be polished, a metal generated by polishing a metal wiring, a plug, or the like that is an object to be polished, and further an organic substance such as a pad debris generated from various pads or the like.

If the surface of the semiconductor substrate is contaminated with these foreign substances, the contamination may adversely affect the electrical properties of the semiconductor to reduce the reliability of the device. Therefore, it is desirable to introduce a surface treatment step after the CMP step to remove these foreign substances from the surface of the semiconductor substrate.

As a composition for surface treatment used in such a cleaning step, for example, Japanese Patent Laid-Open No. 2012-74678 (corresponding to US Patent Application Publication No. 2013/0174867) discloses a substrate cleaning liquid for a semiconductor device containing a polycarboxylic acid or a hydroxycarboxylic acid, a sulfonic acid type anionic surfactant, a carboxylic acid type anionic surfactant, and water. It is disclosed that the composition for surface treatment can remove a foreign substance without corroding the surface of the substrate.

SUMMARY OF INVENTION

However, a problem of the technique according to Japanese Patent Laid-Open No. 2012-74678 (corresponding to US Patent Application Publication No. 2013/0174867) is that a foreign substance (residue) cannot be sufficiently removed when cleaning (surface-treating) a polished object to be polished.

Here, the present inventors have studied the relationship between the type of the polished object to be polished and the type of the foreign substance (residue). As a result, the present inventors have found that to the surface of a polished object to be polished including silicon oxide, which is particularly preferably used as a semiconductor substrate, the inorganic oxide abrasive grains contained in the polishing composition used for polishing the object to be polished easily adhere as a residue, and that such a residue containing inorganic oxide abrasive grains can cause deterioration in the performance of a semiconductor device.

The present invention has been made in view of the above problem, and an object thereof is to provide a unit that can sufficiently remove a residue containing inorganic oxide abrasive grains present on the surface of a polished object to be polished containing silicon oxide.

In view of the above problem, the present inventors have made diligent studies. As a result, the present inventors have found that by a surface treatment method for reducing a residue containing inorganic oxide abrasive grains on the surface of a polished object to be polished containing silicon oxide using a composition for surface treatment, wherein the composition for surface treatment contains a zeta potential adjusting agent having an sp value of more than 9 and 11 or less and having a negatively charged functional group and a dispersing medium, and the surface treatment method includes negatively controlling the zeta potential of the silicon oxide and controlling the zeta potential of the inorganic oxide abrasive grains to −30 mV or less using the composition for surface treatment, the effect of removing a residue containing inorganic oxide abrasive grains on the surface of the polished object to be polished is improved, and the present inventors have completed the present invention.

One aspect for solving the above problem to be solved by the present invention relates to a surface treatment method for reducing a residue containing inorganic oxide abrasive grains on a surface of a polished object to be polished containing silicon oxide using a composition for surface treatment, wherein the composition for surface treatment contains a zeta potential adjusting agent having an sp value of more than 9 and 11 or less and having a negatively charged functional group and a dispersing medium, and the surface treatment method includes negatively controlling a zeta potential of the silicon oxide and controlling a zeta potential of the inorganic oxide abrasive grains to −30 mV or less using the composition for surface treatment.

Another aspect for solving the above problem to be solved by the present invention relates to a composition for surface treatment used for reducing a residue containing inorganic oxide abrasive grains on a surface of a polished object to be polished containing silicon oxide, the composition for surface treatment containing a zeta potential adjusting agent having an sp value of more than 9 and 11 or less and having a negatively charged functional group and a dispersing medium, and having a function of negatively controlling a zeta potential of the silicon oxide and controlling a zeta potential of the inorganic oxide abrasive grains to −30 mV or less.

DESCRIPTION OF EMBODIMENTS

Hereinafter, embodiments of the present invention will be described, but the present invention is not limited only to the following embodiments. Herein, unless otherwise specified, operations and measurements of physical properties or the like are carried out under conditions of room temperature (20° C. or more and 25° C. or less)/a relative humidity of 40% RH or more and 50% RH or less. In addition, as used herein, the "inorganic oxide abrasive grains" contained in the polishing composition may be simply referred to as "abrasive grains". Further, an object to be polished after polishing (an object to be polished after polished in a polishing step) is also simply referred to as a "polished object to be polished."

As described above, the surface treatment method of the present invention is a surface treatment method for reducing a residue containing inorganic oxide abrasive grains on a surface of a polished object to be polished containing silicon oxide using a composition for surface treatment, wherein the composition for surface treatment contains a zeta potential adjusting agent having an sp value of more than 9 and 11 or less and having a negatively charged functional group and a dispersing medium, and the surface treatment method includes negatively controlling a zeta potential of the silicon oxide and controlling a zeta potential of the inorganic oxide abrasive grains to −30 mV or less using the composition for surface treatment.

The method including negatively controlling a zeta potential of the silicon oxide and controlling a zeta potential of the inorganic oxide abrasive grains to −30 mV or less using the composition for surface treatment is not particularly limited, and is preferably a method including contacting a composition for surface treatment containing a zeta potential adjusting agent having an sp value of more than 9 and 11 or less and having a negatively charged functional group and a dispersing medium with a surface of a polished object to be polished.

According to the present invention, a mean that can sufficiently remove a residue containing inorganic oxide abrasive grains present on the surface of a polished object to be polished is provided.

In addition, according to another embodiment of the present invention, a surface treatment method including treating a surface of a polished object to be polished containing silicon oxide using a composition for surface treatment containing a zeta potential adjusting agent having an sp value of more than 9 and 11 or less and having a negatively charged functional group and a dispersing medium is provided.

As used herein, the surface treatment refers to a treatment that removes a residue on the surface of a polished object to be polished, and represents a treatment that carries out cleaning in a broad sense. The surface treatment method according to one embodiment of the present invention is carried out by a method involving contacting a composition for surface treatment directly with a polished object to be polished. The surface treatment is not particularly limited, and is preferably carried out, for example, by a rinse polishing treatment or a cleaning treatment.

The surface treatment method according to one embodiment of the present invention is preferably a method by a rinse polishing treatment. The reason for this is that the polishing treatment can be carried out in the presence of pressure and can physically desorb a residue on the surface of a substrate and more strongly adsorb a zeta potential adjusting agent onto a substrate or a residue, and thus a residue containing inorganic oxide abrasive grains can be reduced more efficiently. In addition, in the surface treatment method of the present invention, from the viewpoint of more efficiently reducing a residue containing inorganic oxide abrasive grains, after the surface treatment of a polished object to be polished, washing with water (post-cleaning treatment described later) is preferably carried out.

The surface treatment (rinse polishing treatment and cleaning treatment) and the post-cleaning treatment will be described later.

According to another embodiment of the present invention, a composition for surface treatment used for reducing a residue containing inorganic oxide abrasive grains on a surface of a polished object to be polished containing silicon oxide, the composition for surface treatment containing a zeta potential adjusting agent having an sp value of more than 9 and 11 or less and having a negatively charged functional group and a dispersing medium, and having a function of negatively controlling a zeta potential of the silicon oxide and controlling a zeta potential of the inorganic oxide abrasive grains to −30 mV or less is also provided.

In addition, as described above, the composition for surface treatment according to the present invention is suitably used in a rinse polishing treatment or a cleaning treatment. Therefore, the composition for surface treatment according to the present invention can be a rinse polishing composition or a cleaning composition.

The surface treatment method of the present invention is characterized by the relationship between a composition for surface treatment and a polished object to be polished, which is to be subjected to surface treatment (that is, an object to be surface-treated) using the composition for surface treatment. Specifically, the surface treatment method of the present invention results from the finding that the relationship among a composition for surface treatment, a component contained in a polished object to be polished, and a component contained in a polishing composition with which the polished object to be polished is polished (more specifically, a component of the polishing composition adhering to the surface of the polished object to be polished as a residue: abrasive grains) affects the reduction of the residue on the surface of the polished object to be polished. This is because, as will be described later, the surface treatment method of the present invention considers that the effect of the present invention is exhibited based on the charge (zeta potential) on the surface of the polished object to be polished and the component (abrasive grains) of the polishing composition present as a residue on the surface of the polished object to be polished.

In the following, first, a residue present on the surface of a polished object to be polished and a polished object to be polished which is to be surface-treated will be described.

[Residue]

As used herein, the residue refers to a foreign substance adhering to the surface of a polished object to be polished. Examples of the residue is not particularly limited, and include a particulate abrasive grain residue derived from abrasive grains contained in a polishing composition, organic residues described later, and another foreign substance.

As used herein, the organic residue refers to a component including an organic substance such as an organic low molecular weight compound or a polymer compound, an organic salt, or the like among the foreign substances adhering to the surface of the polished object to be polished.

Examples of the organic residues adhering to the polished object to be polished include a pad debris (for example, polyurethane) generated from the pad used in the polishing treatment or the surface treatment described later, or a component derived from an additive contained in the polishing composition used in the polishing treatment or in the composition for surface treatment used in the surface treatment. In the present invention, the number of polyurethane residues is calculated as the organic residues in the Examples described later, and thus in the following, the organic residues mean organic residues including polyurethane.

The total number of residues refers to the total number of all residues regardless of the types thereof. The total number of residues can be measured using a wafer defect inspection apparatus (for example, optical inspection machine Surfscan (registered trademark) SP5, manufactured by KLA-Tencor Corporation). Details of the method for measuring the total number of residues will be described in Examples described later.

An abrasive grain residue, organic residues, and another foreign substance are greatly different in color and shape from one another, and thus it can be determined by SEM observation whether a foreign substance is an abrasive grain residue, organic residues (for example, a polyurethane residue), or another foreign substance. In addition, it may be determined by elemental analysis using an energy dispersive X-ray analyzer (EDX) as necessary whether a foreign substance is an abrasive grain residue, organic residues, or another foreign substance, what the type of the abrasive grain residue is, and what the type of the organic residues is. Details of the methods for measuring the number of abrasive grain residues and the number of polyurethane residues will be described in Examples described later.

In the surface treatment method of the present invention, the zeta potential of a residue on the surface of a polished object to be polished can be controlled using a composition for surface treatment. Specifically, according to the surface treatment method of the present invention, the zeta potential of the inorganic oxide abrasive grains (preferably cerium oxide abrasive grains) contained in the residue is controlled to −30 mV or less. Here, as used herein, the inorganic oxide abrasive grains mean inorganic oxide used as abrasive grains in a polishing composition. Therefore, when the residue contains inorganic oxide abrasive grains, the inorganic oxide abrasive grains become an abrasive grain residue.

From the viewpoint of the effect of the present invention, preferable examples of the inorganic oxide abrasive grains contained in the residue are not particularly limited and include cerium oxide abrasive grains and anion-modified silicon oxide abrasive grains, which are preferable abrasive grains in the description of the polishing composition described later. Therefore, according to the surface treatment method according to one preferable embodiment of the present invention, the inorganic oxide abrasive grains contain at least one selected from the group consisting of cerium oxide abrasive grains and anion-modified silicon oxide abrasive grains, and the zeta potential of at least one selected from the group consisting of cerium oxide abrasive grains and anion-modified silicon oxide abrasive grains is controlled to −30 mV or less using a composition for surface treatment. Then, according to the surface treatment method according to one more preferable embodiment of the present invention, the inorganic oxide abrasive grains contain cerium oxide abrasive grains, and the zeta potential of the cerium oxide abrasive grains is controlled to −30 mV or less using a composition for surface treatment. When the zeta potential of the inorganic oxide abrasive grains contained in the residue exceeds −30 mV, the residue may aggregate, and if a coarse particle is formed thereby, the coarse particle may not be able to be removed by surface treatment.

In addition, in one preferable embodiment of the present invention, the zeta potential of the polyurethane contained in the residue is controlled to −10 mV or less. That is, according to the surface treatment method according to one preferable embodiment of the present invention, the residue further contains polyurethane, and the surface treatment method further includes controlling the zeta potential of the polyurethane to −30 mV or less using a composition for surface treatment. When the zeta potential of the polyurethane contained in the residue exceeds −30 mV, the residue may aggregate, and if a coarse particle is formed thereby, the coarse particle may not be able to be removed by surface treatment.

The zeta potential of the inorganic oxide abrasive grains (preferably at least one selected from the group consisting of cerium oxide abrasive grains and anion-modified silicon oxide abrasive grains, and more preferably cerium oxide abrasive grains) contained in the residue is preferably −65 mV or more, more preferably −60 mV or more, further preferably −55 mV or more, and particularly preferably −50 mV or more. In addition, the zeta potential of the inorganic oxide abrasive grains (preferably at least one selected from the group consisting of cerium oxide abrasive grains and anion-modified silicon oxide abrasive grains and more preferably cerium oxide abrasive grains) contained in the residue is preferably −31 mV or less, more preferably −32 mV or less, further preferably −34 mV or less, and most preferably −35 mV or less. In the surface treatment method, the zeta potential of the inorganic oxide abrasive grains is controlled to a value within the above ranges, and thereby the effect of the present invention is further exerted. In addition, the composition for surface treatment has the function of controlling the zeta potential of the inorganic oxide abrasive grains to a value within the above ranges, and thereby the effect of the present invention is further exerted.

In addition, the zeta potential of the polyurethane contained in the residue is preferably −75 mV or more, more preferably −70 mV or more, further preferably −69 mV or more, and particularly preferably −65 mV or more. In addition, the zeta potential of the polyurethane contained in the residue is preferably −30 mV or less, more preferably −33 mV or less, further preferably −35 mV or less, and particularly preferably −40 mV or less. In the surface treatment method, the zeta potential of the polyurethane is controlled to a value within the above ranges, and thereby the effect of the present invention is further exerted. In addition, the composition for surface treatment has the function of controlling the zeta potential of the polyurethane to a value within the above ranges, and thereby the effect of the present invention is further exerted.

Herein, the zeta potential of the inorganic oxide abrasive grains contained in the residue can be measured by Zetasizer Nano ZSP manufactured by Spectris Co., Ltd. (Malvern Division). The zeta potential of the polyurethane contained in the residue can be measured using a solid zeta potential measuring instrument SurPASS 3 manufactured by Anton Paar Japan K.K. Details of the measurement method will be described in Examples.

The zeta potential of the residue can be controlled, for example, by the type and amount of the zeta potential adjusting agent, the pH of the composition for surface treatment, or the like. By increasing the negative charge of the zeta potential adjusting agent in the state of being present in the composition for surface treatment, the zeta potentials of the inorganic oxide abrasive grains and polyurethane can be lowered. For example, an anionic surfactant can be selected as the zeta potential adjusting agent, or a group included in the anionic surfactant can be selected. Above all, selecting a specific group as described later, the zeta potentials of the inorganic oxide abrasive grains and the polyurethane can be further lowered. In addition, by appropriately lowering the pH of the composition for surface treatment to a range not too low, the zeta potentials of the inorganic oxide abrasive grains and the polyurethane can be further lowered. Then, by increasing the amount of the zeta potential adjusting agent in the composition for surface treatment, the zeta potential lowering action of the zeta potential adjusting agent can be further enhanced.

[Polished Object to be Polished]

As used herein, the polished object to be polished means an object to be polished after polished in a polishing step. The polishing step is not particularly limited, and is preferably a CMP step.

The composition for surface treatment according to one aspect of the present invention is used for reducing a residue remaining on the surface of a polished object to be polished containing silicon oxide. Examples of the polished object to be polished containing silicon oxide include a TEOS-type silicon oxide surface (hereinafter, also simply referred to as a "TEOS") generated by using tetraethyl orthosilicate as a precursor, an HDP film, a USG film, a PSG film, a BPSG film, and an RTO film.

The polished object to be polished is preferably a polished semiconductor substrate and more preferably a semiconductor substrate after CMP. The reason for this is that a residue can cause the destruction of a semiconductor device and thus when the polished object to be polished is a polished semiconductor substrate, it is required that the residue can be removed as much as possible in a cleaning step of the semiconductor substrate.

The polished object to be polished containing silicon oxide is not particularly limited, and examples thereof include a polished object to be polished made of silicon oxide alone, and a polished object to be polished in a state where a material other than silicon oxide is exposed on the surface. Here, examples of the former include a silicon oxide substrate, which is a semiconductor substrate. In addition, regarding the latter, examples of the material other than silicon oxide include silicon nitride, polysilicon, and tungsten. Specific examples of such a polished object to be polished include a polished semiconductor substrate having a structure in which a silicon oxide film is formed on silicon nitride, polysilicon, or tungsten, and a polished semiconductor substrate having a structure in which a silicon nitride, polysilicon, or tungsten portion, and a silicon oxide film are all exposed.

The surface treatment method of the present invention can control the zeta potential of the silicon oxide contained in the polished object to be polished, using the composition for surface treatment. Specifically, according to the surface treatment method of the present invention, the zeta potential of the silicon oxide is negatively controlled.

The zeta potential of the silicon oxide contained in the polished object to be polished is preferably −55 mV or more and −1 mV or less, more preferably −50 mV or more and −2 mV or less, further preferably −49 mV or more and −10 mV or less, furthermore preferably −45 mV or more and −20 mV or less, and most preferably −42 mV or more and −30 mV or less. When the zeta potential of the silicon oxide is in the above ranges, the initial effect of the present invention is further exerted.

The zeta potential of the silicon oxide can be controlled, for example, by the type and amount of the zeta potential adjusting agent, the pH of the composition for surface treatment, and the like. By increasing the negative charge of the zeta potential adjusting agent in the state of being present in the composition for surface treatment, the zeta potential of the silicon oxide contained in the polished object to be polished can be lowered. For example, by selecting an anionic surfactant as the zeta potential adjusting agent, selecting a group included in an anionic surfactant, or above all, selecting a specific group as described later, the zeta potentials of the silicon oxide contained in the polished object to be polished can be further lowered. In addition, by appropriately lowering the pH of the composition for surface treatment to a range not too low, the zeta potential of the silicon oxide contained in the polished object to be polished can be further lowered. Then, by increasing the amount of the zeta potential adjusting agent in the composition for surface treatment, the zeta potential lowering action of the zeta potential adjusting agent can be further enhanced.

In the surface treatment method of the present invention, silicon nitride may be contained as a material other than silicon oxide in the polished object to be polished. When silicon nitride is contained as the inorganic oxide abrasive grains contained in the residue, the zeta potential of the silicon nitride can be negatively controlled, for example, at a pH of less than 4. In this case, the zeta potential of the silicon nitride contained in the polished object to be polished is preferably −65 mV or more and −1 mV or less, more preferably −62 mV or more and −2 mV or less, further preferably −60 mV or more and −10 mV or less, furthermore preferably −58 mV or more and −15 mV or less, even further more preferably −55 mV or more and −30 mV or less, and most preferably −52 mV or more and −35 mV or less.

Next, the composition for surface treatment used in the surface treatment method of the present invention will be described.

[Composition for Surface Treatment]

One aspect of the present invention is a composition for surface treatment that contains a zeta potential adjusting agent having an sp value of more than 9 and 11 or less and having a negatively charged functional group and a dispersing medium and that is used for treating the surface of a polished object to be polished. Here, some components of the polishing composition easily adhere to the surface of the polished object to be polished and these remain on the surface of the polished object to be polished after the polishing treatment. In particular, the inorganic oxide abrasive grains contained in the polishing composition tend to remain on the surface of the polished object to be polished. In this case, the inorganic oxide abrasive grains remaining on the surface of the polished object to be polished may cause a foreign substance. The composition for surface treatment according to the present invention can remove such a residue (that is, inorganic oxide abrasive grains) derived from the polishing composition remaining on the surface of the polished object to be polished.

The composition for surface treatment according to the present invention can negatively control the zeta potential of the silicon oxide contained in the polished object to be polished and control the zeta potential of the inorganic oxide abrasive grains present as a residue on the surface of the polished object to be polished to −30 mV or less. That is, when the polished object to be polished comes into contact with the composition for surface treatment according to the present invention, the zeta potentials of the silicon oxide and the inorganic oxide abrasive grains on the surface of the polished object to be polished are controlled within the above ranges. Thereby, the composition for surface treatment according to the present invention can be used as a residue reducing agent for being able to efficiently remove the residue (inorganic oxide abrasive grains) in the surface treatment step.

Therefore, according to the present invention, a composition for surface treatment used for reducing a residue containing inorganic oxide abrasive grains on a surface of a polished object to be polished containing silicon oxide, the composition for surface treatment containing a zeta potential adjusting agent having an sp value of more than 9 and 11 or less and having a negatively charged functional group and a dispersing medium, and having a function of negatively controlling a zeta potential of the silicon oxide and controlling a zeta potential of the inorganic oxide abrasive grains to −30 mV or less is also provided.

In addition, in the composition for surface treatment, the inorganic oxide abrasive grains contain cerium oxide abrasive grains, and the composition for surface treatment has the function of controlling the zeta potential of the cerium oxide abrasive grains to −30 mV or less.

In addition, the composition for surface treatment according to the present invention can also efficiently remove a pad debris (polyurethane) generated from the pad used in the polishing treatment or the surface treatment. That is, such a pad debris is also present as a residue on the surface of the polished object to be polished, and when the pad debris is polyurethane, the composition for surface treatment according to the present invention can efficiently remove the pad debris by controlling the zeta potential of the polyurethane on the surface of the polished object to be polished. Therefore, in the composition for surface treatment according to the present invention, the residue further contains polyurethane, and the composition for surface treatment further has the function of controlling the zeta potential of the polyurethane to −30 mV or less.

The present inventors presume the mechanism by which the above problem is solved by the present invention, as follows.

The zeta potential adjusting agent contained in the composition for surface treatment has an sp value of more than 9 and 11 or less and has a negatively charged functional group, and thus adheres to the surface of the residue (inorganic oxide abrasive grains, polyurethane) present on the surface of the polished object to be polished to form a hydrophilic layer. In addition, the zeta potential adjusting agent also adheres to the surface of the polished object to be polished in the composition for surface treatment to form a hydrophilic layer. The residue on which a hydrophilic layer is formed has an affinity for the surface of the polished object to be polished that has been hydrophilized, and thus maintains the state of adhesion to the polished object to be polished without moving from the surface of the polished object to be polished (for example, moving to the polishing pad side) during the surface treatment step. After that, by washing with water (post-cleaning treatment described later), the hydrophilic layer on the surface of the polished object to be polished is easily removed, and the residue on the surface of the polished object to be polished is also removed.

Therefore, the composition for surface treatment according to the present invention has the function of removing a residue on the surface of the polished object to be polished, or the function of facilitating the removal of that, by a chemical interaction between each component contained in the composition for surface treatment and both the surface of the polished object to be polished and the residue on the surface of the polished object to be polished.

The above mechanism is based on speculation, and whether the mechanism is correct or incorrect does not affect the technical scope of the present invention.

Hereinafter, each component contained in the composition for surface treatment will be described.

[Zeta Potential Adjusting Agent]

The composition for surface treatment according to one aspect of the present invention contains a zeta potential adjusting agent having an sp value of more than 9 and 11 or less and having a negatively charged functional group. Here, the sp value is a solubility parameter, and the sp value of the zeta potential adjusting agent herein is a value calculated by the Fedors method (Reference: R. F. Fedors, Polym. Eng. Sci., 14[2] 147 (1974)).

The sp value of the zeta potential adjusting agent is more than 9 and 11 or less, preferably more than 9 and 10.9 or less, and more preferably 9.5 or more and 10.8 or less. When the sp value is more than 9 and 11 or less, the affinity between the zeta potential adjusting agent and the residue on the surface of the polished object to be polished increases, and the zeta potential adjusting agent easily adheres to the residue. When the sp value of the zeta potential adjusting agent is 9 or less, the sp value thereof is greatly far from the sp value (23) of water, and thus the zeta potential adjusting agent does not easily dissolve in a dispersing medium (for example, water), and the zeta potential adjusting agent itself easily becomes a residue on the surface. When the sp value of the zeta potential adjusting agent exceeds 11, the sp value thereof comes close to the sp value (23) of water, and based thereon, the zeta potential adjusting agent becomes more stable when it dissolves in a surrounding dispersing medium (for example, water) than when it adsorbs onto the surface of the polished object to be polished or the residue, and the effect of the present invention is not exerted.

The zeta potential adjusting agent has a negatively charged functional group. Examples of such a functional group include at least one functional group selected from the group consisting of a sulfonic acid (salt) group, a sulfuric acid (salt) group, a phosphonic acid (salt) group, and a phosphoric acid (salt) group. When the negatively charged functional group is any of these groups, the effect of removing the residue containing inorganic oxide abrasive grains present on the surface of the polished object to be polished containing silicon oxide further improves. It is presumed that the reason for this is that by negatively charging both the polished object to be polished and the surface of the residue, the charge repulsion is enabled and the residue can be desorbed and prevented from adhering again.

The zeta potential adjusting agent is preferably an anionic surfactant and more preferably an anionic surfactant having a weight average molecular weight of less than 1,000. The anionic surfactant easily forms a hydrophilic layer on the residue, and the formed hydrophilic layer can be easily removed by washing with water (post-cleaning treatment described later), and the anionic surfactant contributes to the removal of the residue using a composition for surface treatment. Therefore, the composition for surface treatment containing an anionic surfactant can sufficiently remove the residue remaining on the surface of the polished object to be polished in the surface treatment of the polished object to be polished.

The weight average molecular weight of the anionic surfactant is preferably less than 1,000, more preferably 200 or more and less than 1,000, further preferably 500 or more and 980 or less, and further preferably 800 or more and 959 or less. When the weight average molecular weight of the anionic surfactant is in the above ranges, the affinity for the residue can be improved, and the desired effect of the present invention can be even further exerted. The weight average molecular weight of the anionic surfactant can be calculated by a molecular formula thereof or measured as a value in terms of polyethylene glycol using gel permeation chromatography (GPC).

Examples of such an anionic surfactant include a compound including at least one functional group selected from the group consisting of a sulfonic acid (salt) group, a sulfuric acid (salt) group, a phosphonic acid (salt) group, and a phosphoric acid (salt) group. Of these, as the functional group, a sulfuric acid (salt) group, a phosphonic acid (salt) group, and a phosphoric acid (salt) group are preferable, and a sulfuric acid (salt) group and a phosphoric acid (salt) group are more preferable.

The acid (salt) as used herein means that the target group or compound may be in the form of an acid or in the form of a salt. Here, the sulfonic acid group refers to a sulfo group, the sulfuric acid group refers to a group represented by $-OSO_3H$, the phosphonic acid group refers to a phospho group (a group represented by $-PO_3H_2$), and the phosphoric acid group refers to a group represented by $-OPO_3H_2$. The phosphonic acid salt group and the phosphoric acid salt group may each be an acid salt group in which one H remains. These groups may be each in the form of a salt, the salt is not particularly limited, and examples thereof include an alkali metal salt such as a lithium salt, a sodium salt, or a potassium salt, a salt of a Group 2 element such as a calcium salt, an amine salt, and an ammonium salt. Among these, an alkali metal salt is preferable, and a sodium salt is more preferable. The type of the salt may be one alone or a combination of two or more.

The type of the anionic surfactant used in the present invention will be described. The anionic surfactant described below may be a low molecular weight type surfactant or a polymer type surfactant, and, in order to even further exert the effect of the present invention, is preferably a low molecular weight type surfactant. As used herein, "the low molecular weight type surfactant" refers to a compound having a molecular weight of less than 1000. The molecular weight of the compound can be determined, for example, using a known mass spectrometric unit such as TOF-MS or LC-MS. On the other hand, as used herein, the "polymer type surfactant" refers to a compound having a molecular weight (weight average molecular weight) of 1000 or more. The weight average molecular weight can be measured by gel permeation chromatography (GPC).

(Compound Having Sulfonic Acid (Salt) Group)

The compound having a sulfonic acid (salt) group as the anionic surfactant according to the present invention is not particularly limited as long as it is a surfactant having a sulfonic acid (salt) group.

Examples of the compound having a sulfonic acid (salt) group include a sulfonic acid such as alkylbenzenesulfonic acid (for example, n-dodecylbenzenesulfonic acid), alkylsulfonic acid (for example, laurylsulfonic acid), alkyl diphenyl ether disulfonic acid (for example, lauryl diphenyl ether disulfonic acid), or alkylnaphthalenesulfonic acid (for example, laurylnaphthalenesulfonic acid), or a salt thereof. Examples of such a salt of a sulfonic acid include an alkali metal salt such as a sodium salt, a salt of a Group 2 element such as a calcium salt, an amine salt, and an ammonium salt. In particular, when the polished object to be polished is a semiconductor substrate after the CMP step, a sodium salt, an amine salt, or an ammonium salt is preferable from the viewpoint of removing the residue on the surface of the substrate as much as possible. For example, as the anionic surfactant having a sulfonic acid (salt) group, ammonium lauryl sulfonate and sodium lauryl diphenyl ether disulfonate are preferable.

Examples of a commercially available product thereof that can be used include sulfonic acid group-containing modified polyvinyl alcohol (manufactured by The Nippon Synthetic Chemical Industry Co., Ltd., GOHSENX L series), a sulfonic acid group-containing copolymer (manufactured by Toagosei Co., Ltd., Aron (registered trademark) A series), a sulfonic acid group-containing copolymer (manufactured by Akzo Nobel N.V., VERSA (registered trademark, the same applies hereinafter) series, NARLEX (registered trademark, the same applies hereinafter) series; manufactured by Tosoh Finechem Corporation, ST series, MA series), polystyrenesulfonic acid (salt) (manufactured by Tosoh Finechem Corporation, PolyNaSS (registered trademark, the same applies hereinafter) series), and an alkyldiphenyl ether disulfonate (manufactured by TAKEMOTO OIL & FAT Co., Ltd., PIONIN (registered trademark, the same applies hereinafter) A-43-D, A-43-S; TAKESURF A-43-NQ).

(Compound Having Sulfuric Acid (Salt) Group)

The compound having a sulfuric acid (salt) group as the anionic surfactant according to the present invention is not particularly limited as long as it is a surfactant including a sulfuric acid (salt) group.

Examples of the compound having a sulfuric acid (salt) group include an alkylsulfuric acid ester salt (for example, ammonium lauryl sulfate), a polyoxyalkylene alkyl ether sulfuric acid ester salt, a polyoxyalkylene allyl ether sulfuric acid ester salt, a polyoxyalkylene allyl phenyl ether sulfuric acid ester salt (for example, a polyoxyethylene allyl phenyl ether sulfuric acid ester salt), a polyoxyalkylene alkyl allyl phenyl ether sulfuric acid ester salt (for example, a polyoxyethylene alkyl allyl phenyl ether sulfuric acid ester salt), a polyoxyalkylene phenyl ether sulfuric acid ester salt (for example, a polyoxyethylene phenyl ether sulfuric acid ester salt), and a polyoxyalkylene polycyclic phenyl ether sulfuric acid ester salt. These compounds can be used singly or in combinations of two or more. Examples of the salts are the same as those described in the above (Compound having sulfonic acid (salt) group). For example, as the anionic surfactant having a sulfuric acid (salt) group, ammonium lauryl sulfate and ammonium polyoxyethylene allyl phenyl ether sulfate are preferable.

As the anionic surfactant having a sulfuric acid (salt) group, a commercially available product or a synthetic product may be used. Examples of the above commercially available product include a polyoxyalkylene allyl phenyl ether sulfuric acid ester salt (salt) (manufactured by TAKEMOTO OIL & FAT Co., Ltd., NEWKALGEN (registered trademark, the same applies hereinafter) FS-7S), a polyoxyethylene allyl phenyl ether sulfuric acid ester salt (manufactured by DKS Co., Ltd., HITENOL (registered trademark, the same applies hereinafter) NF08), a polyoxyethylene alkyl allyl phenyl ether sulfuric acid ester salt (manufactured by DKS Co., Ltd., AQUALON (registered trademark, the same applies hereinafter) HS-10), a polyoxyethylene alkyl ether sulfuric acid ester salt (manufactured by Nippon Nyukazai Co., Ltd., Newcol (registered trademark, the same applies hereinafter) 1020-SN), a polyoxyethylene polycyclic phenyl ether sulfuric acid ester salt (manufactured by Nippon Nyukazai Co., Ltd., Newcol 707 series), and a polyoxyethylene allyl ether sulfuric acid ester salt (Newcoal B4-SN manufactured by Nippon Nyukazai Co., Ltd.).

(Compound Having Phosphonic Acid (Salt) Group)

The compound having a phosphonic acid (salt) group as the anionic surfactant according to the present invention is not particularly limited as long as it is a surfactant having a phosphonic acid (salt) group.

As the compound having a phosphonic acid (salt) group, a known compound such as dodecylphosphonic acid can be used. These compounds can be used singly or in combinations of two or more. Examples of the salt are the same as those described in the above (Compound having sulfonic acid (salt) group).

(Compound Having Phosphoric Acid (Salt) Group)

The compound having a phosphoric acid (salt) group as the anionic surfactant according to the present invention is not particularly limited as long as it is a surfactant having a phosphoric acid (salt) group.

Examples of the compound having a phosphoric acid (salt) group include monoalkylphosphoric acid, alkyl ether phosphoric acid, polyoxyethylene alkyl ether phosphoric acid, polyoxyethylene allyl phenyl ether phosphoric acid, and polyoxyethylene alkyl phenyl ether phosphoric acid. These compounds can be used singly or in combinations of two or more. Examples of the salt are the same as those described in the above (Compound having sulfonic acid (salt) group).

As the compound having a phosphoric acid (salt) group, a commercially available product or a synthetic product may be used. Examples of the above commercially available product include polyoxyethylene alkyl ether phosphoric acid (manufactured by Nikko Chemicals Co., Ltd., NIKKOL (registered trademark, the same applies hereinafter) DLP, DOP, DDP, TLP, TCP, TOP, TDP series) and a polyoxyethylene allyl phenyl ether phosphoric acid salt (manufactured by TAKEMOTO OIL & FAT Co., Ltd., phosphoric acid ester (phosphate) type series (NEWKALGEN FS-3AQ, NEWKALGEN FS-3PG, and the like)).

When the anionic surfactant has an alkyl group, the alkyl group is preferably a linear or branched alkyl group having 6 to 20 carbon atoms. In addition, the anionic surfactant preferably has a structure in which ethylene oxide is added, and the number of moles of ethylene oxide added is preferably 2 to 18, more preferably 3 to 15, and further preferably 3 to 12.

As the zeta potential adjusting agent, a commercially available product or a synthetic product may be used. The production method in the case of synthesis is not particularly limited, and the zeta potential adjusting agent can be obtained by a known synthesis method.

Such zeta potential adjusting agents can be used singly or in combinations of two or more.

The content (concentration) of the zeta potential adjusting agent (in the case of two or more, the total amount thereof) is not particularly limited, and is preferably 0.001 g/kg or more, more preferably 0.01 g/kg or more, further preferably 0.03 g/kg or more, particularly preferably 0.05 g/kg or more, and most preferably 0.08 g/kg or more based on the total mass of the composition for surface treatment. When the content of the zeta potential adjusting agent is 0.001 g/kg or more, the effect of the present invention further improves. In addition, the upper limit of the content of the zeta potential adjusting agent is not particularly limited, and is preferably 10 g/kg or less, more preferably 5 g/kg or less, further preferably 1 g/kg or less, particularly preferably 0.5 g/kg or less, and most preferably 0.3 g/kg or less based on the total mass of the composition for surface treatment. When the content of the zeta potential adjusting agent is 10 g/kg or less, the zeta potential adjusting agent itself can be easily removed after the surface treatment.

[Dispersing Medium]

The composition for surface treatment according to the present invention contains a dispersing medium (solvent) for dissolving or dispersing each component. The dispersing medium preferably contains water, and more preferably is water alone. In addition, the dispersing medium may be a mixed solvent of water and an organic solvent for dispersion or dissolution of each component. Examples of the organic solvent include an alcohol such as methanol, ethanol, isopropanol, ethylene glycol, propylene glycol, or glycerin; a ketone such as acetone; and acetonitrile. Therefore, examples of the dispersing medium include water; an alcohol such as methanol, ethanol, isopropanol, ethylene glycol, propylene glycol, or glycerin; a ketone such as acetone; acetonitrile; and mixtures thereof. Of these, water is preferable as the dispersing medium. In addition, these organic solvents may be used without being mixed with water to disperse or dissolve each component and then to be mixed with water. These organic solvents can be used singly or in combinations of two or more. When a dispersing medium other than water is contained, the content of water based on the total mass of the dispersing medium is preferably 90% by mass or more and 100% by mass or less and more preferably 99% by mass or more and 100% by mass or less. However, the dispersing medium is most preferably water alone.

From the viewpoint of not inhibiting the action of a component contained in the composition for surface treatment, water containing no or a minimum of an impurity is preferable as the dispersing medium. For example, water having a total content of a transition metal ion of 100 ppb or less is preferable. Here, the purity of water can be increased, for example, by an operation such as removal of an impurity ion using an ion exchange resin, removal of a foreign substance through a filter, or distillation. Specifically, deionized water, pure water, ultrapure water, or distilled water obtained by removing an impurity ion using an ion exchange resin and then removing a foreign substance through a filter is more preferable.

[PH and pH Adjusting Agent]

The pH of the composition for surface treatment according to the present invention is preferably 2 or more and less than 5. When the pH of the composition for surface treatment is in the above range, the zeta potential of cerium oxide is positively charged and the cerium oxide electrically attracts the zeta potential adjusting agent, and thus as a result, an abrasive grain residue (for example, cerium oxide) can be negatively charged. Thereby, the desired effect of the present invention is further exerted. The pH of the composition for surface treatment according to the present invention may be 2 or more, and is preferably 2.5 or more and more preferably 3 or more. The pH of the composition for surface treatment according to the present invention may be 5 or less, and is preferably less than 4.5, more preferably 4 or less, and further preferably 3.5 or less.

The pH of the composition for surface treatment can be measured, for example, using a pH meter (for example, manufactured by HORIBA, Ltd., model number: LAQUA).

The composition for surface treatment according to the present invention contains a zeta potential adjusting agent and a dispersing medium as essential components, but when it is difficult to obtain the desired pH with these alone, the pH may be adjusted by adding a pH adjusting agent (a pH adjusting agent that is a compound different from the above zeta potential adjusting agent) as long as it does not inhibit the effect of the present invention. The composition for surface treatment according to the present invention further contains a pH adjusting agent in one embodiment.

As the pH adjusting agent, a known acid or base, or a salt thereof can be used.

Specific examples of the acid that can be used as the pH adjusting agent include an inorganic acid such as hydrochloric acid, sulfuric acid, nitric acid, hydrofluoric acid, boric acid, carbonic acid, hypophosphorous acid, phosphorous acid, and phosphoric acid, and an organic acid such as formic acid, acetic acid, propionic acid, butyric acid, pentanoic acid, 2-methylbutyric acid, hexanoic acid, 3,3-dimethyl-butyric acid, 2-ethylbutyric acid, 4-methylpentanoic acid, heptanoic acid, 2-methylhexanoic acid, octanoic acid, 2-ethylhexanoic acid, benzoic acid, hydroxyacetic acid, salicylic acid, glyceric acid, oxalic acid, malonic acid, succinic acid, glutaric acid, adipic acid, pimelic acid, maleic acid, phthalic acid, malic acid, tartaric acid, citric acid, lactic acid, diglycolic acid, 2-furancarboxylic acid, 2,5-furandicarboxylic acid, 3-furancarboxylic acid, 2-tetrahydrofurancarboxylic acid, methoxyacetic acid, methoxyphenylacetic acid, 2-hydroxyisobutyric acid, and phenoxyacetic acid. When an inorganic acid is used as the pH adjusting agent, sulfuric acid, nitric acid, phosphorous acid, phosphoric acid, and the like are particularly preferable. In addition, when an organic acid is used as the pH adjusting agent, acetic acid, lactic acid, benzoic acid, hydroxyacetic acid, maleic acid, citric acid, tartaric acid, and hydroxyisobutyric acid are preferable, and maleic acid, citric acid, and tartaric acid are more preferable.

Examples of the base that can be used as the pH adjusting agent include an amine such as an aliphatic amine or an aromatic amine, an ammonium solution, an organic base such as tetraammonium hydroxide, an alkali metal hydroxide such as potassium hydroxide, a hydroxide of a Group 2 element, an amino acid such as histidine, and ammonia.

The composition for surface treatment contains preferably an acid, more preferably an inorganic acid, further preferably at least one selected from the group consisting of sulfuric acid, nitric acid, phosphorous acid, and phosphoric acid, and particularly preferably nitric acid.

As the pH adjusting agent, a commercially available product or a synthetic product may be used. Such pH adjusting agents may be used singly or in combinations of two or more. The amount of the pH adjusting agent added is not particularly limited and may be appropriately adjusted such that the composition for surface treatment has a desired pH.

[Another Additive]

The composition for surface treatment according to one embodiment of the present invention may contain another additive in an arbitrary proportion as necessary as long as it does not inhibit the effect of the present invention. However, it is desirable to add no or a minimum of a component other than the essential components of the composition for surface treatment according to one embodiment of the present invention because such a component can cause a foreign substance. Therefore, the amount of the component other than the essential components added is preferably as small as possible, and the component is more preferably not contained. Examples of another additive include abrasive grains, an alkali, a polymer compound, an antifungal agent (antiseptic agent), a dissolved gas, a reducing agent, an oxidizing agent, and an alkanolamine. Above all, in order to further improve the foreign substance removal effect, the composition for surface treatment preferably does not substantially contain abrasive grains. Here, "not substantially contain abrasive grains" means that the content of abrasive grains based on the entire composition for surface treatment is 0.01% by mass or less (lower limit of 0% by mass), and the content is preferably 0.005% by mass or less (lower limit of 0% by mass) and more preferably 0.001% by mass or less (lower limit of 0% by mass).

(Polymer Compound)

The composition for surface treatment according to one embodiment of the present invention may contain a polymer compound. The polymer compound is preferably a polymer compound having an anionic group and having a weight average molecular weight of 1,000 or more. The polymer compound is preferably a polymer having an acid (salt) group and having a weight average molecular weight of 1,000 or more. The polymer compound is further preferably a polymer compound having at least one functional group selected from the group consisting of a sulfonic acid (salt) group, a phosphonic acid (salt) group, and a phosphoric acid (salt) group and having a weight average molecular weight of 1,000 or more.

Such polymer compounds can be used singly or in combinations of two or more. In addition, as the polymer compound, a commercially available product or a synthetic product may be used.

When the composition for surface treatment contains a polymer compound, the lower limit of the content of the polymer compound is preferably 0.01% by mass or more, more preferably 0.03% by mass or more, and further preferably 0.05% by mass or more with the total mass of the composition for surface treatment as 100% by mass. In addition, the upper limit of the content of the polymer compound in the composition for surface treatment is preferably 5% by mass or less, more preferably 1% by mass or less, and further preferably 0.5% by mass or less with the total mass of the composition for surface treatment as 100% by mass. When the composition for surface treatment contains two or more polymer compounds, the content of the polymer compounds is intended to be the total amount thereof.

[Antifungal Agent]

The composition for surface treatment according to the present invention preferably contains an antifungal agent (antiseptic agent). When the composition for surface treatment according to the present invention contains an antifungal agent (antiseptic agent), the antifungal agent (antiseptic agent) that can be used is not particularly limited and can be appropriately selected according to the constitution of the composition for surface treatment. Specific examples of the antifungal agent (antiseptic agent) include an isothiazolin-based antiseptic agent such as 2-methyl-4-isothiazolin-3-one or 5-chloro-2-methyl-4-isothiazolin-3-one, and phenoxyethanol.

The above antifungal agents (antiseptic agents) may be used singly or in combinations of two or more.

When the composition for surface treatment contains an antifungal agent (antiseptic agent), the lower limit of the content (concentration) of the antifungal agent (antiseptic agent) is not particularly limited, and is preferably 0.0001% by mass or more, more preferably 0.001% by mass or more, further preferably 0.005% by mass or more, and particularly preferably 0.01% by mass or more. In addition, the upper limit of the content (concentration) of the antifungal agent (antiseptic agent) is not particularly limited, and is preferably 5% by mass or less, more preferably 1% by mass or less, further preferably 0.5% by mass or less, and particularly preferably 0.1% by mass or less. That is, the content (concentration) of the antifungal agent (antiseptic agent) in the composition for surface treatment is preferably 0.0001% by mass or more and 5% by mass or less, more preferably 0.001% by mass or more and 1% by mass or less, further preferably 0.005% by mass or more and 0.5% by mass or less, and particularly preferably 0.01% by mass or more and 0.1% by mass or less. With such ranges, a sufficient effect to inactivate or destroy a microorganism can be obtained. When the composition for surface treatment contains two or more antifungal agents (antiseptic agents), the above content is intended to be the total amount thereof.

That is, in one embodiment of the present invention, the composition for surface treatment is substantially composed of a zeta potential adjusting agent, a pH adjusting agent, and water, and at least one selected from the group consisting of an antifungal agent, an organic solvent, and a polymer compound. In one embodiment of the present invention, the composition for surface treatment is substantially composed of a zeta potential adjusting agent, a pH adjusting agent, and water, and at least one selected from the group consisting of an antifungal agent and an organic solvent. In one embodiment of the present invention, the composition for surface treatment is substantially composed of a zeta potential adjusting agent, a pH adjusting agent, and water. In these embodiments, "the composition for surface treatment is substantially composed of X" means that the total content of X exceeds 99% by mass (upper limit: 100% by mass) with the total mass of the composition for surface treatment as 100% by mass (based on the composition for surface treatment). Preferably, the composition for surface treatment is composed of X (the above total content=100% by mass). For example, "the composition for surface treatment is substantially composed of a zeta potential adjusting agent, a pH adjusting agent, and water, and at least one selected from the group consisting of an antifungal agent, an organic solvent, and a polymer compound" means that the total content of a zeta potential adjusting agent, a pH adjusting agent, and water, and an antifungal agent, an organic solvent, and a polymer compound exceeds 99% by mass (upper limit: 100% by mass) with the total mass of the composition for surface treatment as 100% by mass (based on the composition for surface treatment), and the composition for surface treatment is preferably composed of a zeta potential adjusting agent, a pH adjusting agent, and water, and at least one selected from the group consisting of an antifungal agent, an organic solvent and a polymer compound (the above total content=100% by mass).

The composition for surface treatment according to the present invention can negatively control the zeta potential of the silicon oxide contained in the polished object to be polished and control the zeta potential of the inorganic oxide abrasive grains adhering to the polished object to be polished to −30 mV or less. It is considered that the reason why such control is possible is that the zeta potential adjusting agent contained in the composition for surface treatment has a high affinity for the silicon oxide contained in the polished object to be polished and the inorganic oxide abrasive grains and easily adheres to the surfaces of the silicon oxide and the inorganic oxide abrasive grains. It is considered that the zeta potential adjusting agent negatively charges the silicon oxide and the inorganic oxide abrasive grains, and further leads the zeta potential of the inorganic oxide abrasive grains to −30 mV or less.

[Method for Producing Composition for Surface Treatment]

The method for producing a composition for surface treatment is not particularly limited. For example, a composition for surface treatment can be produced by mixing a zeta potential adjusting agent having an sp value of more than 9 and 11 or less and having a negative functional group and a dispersing medium (for example, water). That is, according to another embodiment of the present invention, the method for producing a composition for surface treatment, including mixing a zeta potential adjusting agent having an sp value of more than 9 and 11 or less and having a negative functional group and a dispersing medium is also provided. The type of the above zeta potential adjusting agent, the amount thereof added, and the like are as described above. Further, in the method for producing a composition for surface treatment according to one embodiment of the present invention, another component other than the zeta potential adjusting agent and the dispersing medium may be further mixed as necessary. The type thereof, the amount thereof added, and the like are as described above.

The order of addition and the method for addition of each component contained in the composition for surface treatment are not particularly limited. Each of the above components may be added collectively or separately, or stepwise or continuously. In addition, the mixing method is not particularly limited either, and a known method can be used. The method for producing a composition for surface treatment preferably includes sequentially adding a zeta potential adjusting agent, a dispersing medium, and another component added as necessary, and stirring these in the dispersing medium. Additionally, the method for producing a composition for surface treatment may further include measuring and adjusting the pH of the composition for surface treatment in such a way as to obtain a desired pH.

Here, the residue on the surface of the polished object to be polished removed by the composition for surface treatment according to the present invention is caused to adhere by the polishing treatment of the object to be polished. That is, the inorganic oxide abrasive grains are a residue derived from the polishing composition, and the pad debris (for example, polyurethane) is a residue derived from the polishing pad used in the polishing treatment. Therefore, the polishing composition and the polishing treatment from which these residues are derived will be described. In other words, how to obtain the polished object to be polished, which is to be subjected to surface treatment, in the surface treatment method of the present invention will be described.

[Polishing Composition]

The polishing composition contains inorganic oxide abrasive grains, a dispersing medium, and, as necessary, an additive. In the present invention, the configuration of the polishing composition is not particularly limited except that inorganic oxide abrasive grains and a dispersing medium are essential, and a preferable configuration of the polishing composition will be described below.

[Abrasion Grains]

Examples of the abrasive grains (inorganic oxide abrasive grains) contained in the polishing composition contain particles made of an inorganic oxide (metal oxide) such as silicon oxide (silica), aluminum oxide (alumina), cerium oxide (ceria), zirconium oxide (zirconia), or titanium oxide (titania). These metal oxides may be surface-modified. For example, the particles may be made of an anion-modified inorganic oxide abrasive grains on which an organic acid such as a carboxylic acid or a sulfonic acid is immobilized. As such an anion-modified inorganic oxide, anion-modified silicon oxide on which an organic acid such as a carboxylic acid or a sulfonic acid is immobilized is preferable, and anion-modified colloidal silica on which an organic acid such as a carboxylic acid or a sulfonic acid is immobilized is more preferable. Such immobilization of an organic acid on the surface of an inorganic oxide abrasive grains is carried out, for example, by chemically bonding an organic acid functional group to the surface of the inorganic oxide abrasive grains. The immobilization of an organic acid on an inorganic oxide abrasive grains cannot be achieved by simply allowing the inorganic oxide abrasive grains and the organic acid to coexist. For example, if sulfonic acid, which is one organic acid, is to be immobilized on colloidal silica, the immobilization can be carried out, for example, by the method described in "Sulfonic acid-functionalized silica through quantitative oxidation of thiol groups", Chem. Commun. 246-247 (2003). Specifically, it is possible to obtain anion-modified colloidal silica in which sulfonic acid is immobilized on the surface thereof by coupling a silane coupling agent having a thiol group such as 3-mercaptopropyltrimethoxysilane to colloidal silica and then oxidizing the thiol group using hydrogen peroxide. Alternatively, if a carboxylic acid is to be immobilized on colloidal silica, the immobilization can be carried out, for example, by the method described in "Novel Silane Coupling Agents Containing a Photolabile 2-Nitrobenzyl Ester for Introduction of a Carboxy Group on the Surface of Silica Gel", Chemistry Letters, 3, 228-229 (2000). Specifically, it is possible to obtain anion-modified colloidal silica in which a carboxylic acid is immobilized on the surface thereof by coupling a silane coupling agent including a photoreactive 2-nitrobenzyl ester to colloidal silica followed by photoirradiation. Among these, anion-modified silicon oxide in which a sulfonic acid is immobilized on the surface thereof (as used herein, also referred to as sulfonic acid-modified silicon oxide) is preferable, and anionic-modified colloidal silica in which a sulfonic acid is immobilized on the surface thereof (as used herein, also referred to as sulfonic acid-modified colloidal silica) is more preferable. The organic acid immobilized on the surface of the inorganic oxide abrasive grains may be in the state of an acid or in the state of a salt.

The abrasive grains (inorganic oxide abrasive grains) are more preferably at least one selected from the group consisting of anion-modified silicon oxide abrasive grains and cerium oxide abrasive grains, further preferably at least one selected from the group consisting of anion-modified colloidal silica abrasive grains and cerium oxide abrasive grains, and particularly preferably cerium oxide abrasive grains from the viewpoint of the removal effect of the composition for surface treatment. The anion-modified silicon oxide abrasive grains and the cerium oxide abrasive grains easily form an affinity layer when contacted with the composition for surface treatment, and are easily removed from the surface of a polished object to be polished by cleaning treatment or the like after surface treatment.

Therefore, according to one preferable embodiment of the surface treatment method of the present invention, the inorganic oxide abrasive grains contained in the residue are at least one selected from the group consisting of anion-modified silicon oxide abrasive grains and cerium oxide abrasive grains, and the zeta potential of at least one selected from the group consisting of anion-modified silicon oxide abrasive grains and cerium oxide abrasive grains is controlled to −30 mV or less using a composition for surface treatment. According to one more preferable embodiment of the surface treatment method of the present invention, the inorganic oxide abrasive grains contained in the residue are cerium oxide abrasive grains, and the zeta potential of the cerium oxide abrasive grains is controlled to −30 mV or less using a composition for surface treatment.

The lower limit of the average primary particle size of the abrasive grains is not particularly limited, and is preferably 5 nm or more, more preferably 7 nm or more, and more preferably 10 nm or more. With these ranges, the desired polishing speed can be easily obtained. In addition, the upper limit of the average primary particle size of the abrasive grains is not particularly limited, and is preferably 50 nm or less, more preferably 40 nm or less, and further preferably 30 nm or less. With these ranges, the effect of the composition for surface treatment according to the present invention is further exerted. The value of the average primary particle size of the abrasive grains can be calculated on the assumption that the particle shape of the inorganic oxide abrasive grains is a true sphere, based on the specific surface area of the abrasive grains measured by the BET method.

The lower limit of the average secondary particle size of the abrasive grains is not particularly limited, and is preferably 5 nm or more, more preferably 10 nm or more, and further preferably 20 nm or more. With these ranges, the desired polishing speed can be easily obtained. In addition, the upper limit of the average secondary particle size of the abrasive grains is not particularly limited, and is preferably 100 nm or less, more preferably 90 nm or less, and further preferably 80 nm or less. With these ranges, the effect of the composition for surface treatment according to the present invention is further exerted. The value of the average secondary particle size of the abrasive grains can be calculated based on a light scattering method using a laser beam.

As the abrasive grains, a synthetic product or a commercially available product may be used.

The lower limit of the content (concentration) of the abrasive grains in the polishing composition is not particularly limited, and is preferably more than 0.01% by mass, more preferably 0.1% by mass or more, and further preferably 0.5% by mass or more based on the total mass of the polishing composition. With these ranges, the desired polishing speed can be easily obtained. In addition, the upper limit of the content (concentration) of the abrasive grains is not particularly limited, and is preferably 10, by mass or less, more preferably 5% by mass or less, and further preferably 3% by mass or less based on the total mass of the polishing composition. With these ranges, the effect of the composition for surface treatment is further exerted in the abrasive grains remaining on the surface of the polished object to be polished.

[Another Component]

The polishing composition may contain another component (additive) other than the inorganic oxide abrasive grains and the dispersing medium, and a component used in a known polishing composition, such as a pH adjusting agent, a surfactant, a wetting agent, a chelating agent, an antiseptic agent, an antifungal agent, a dissolved gas, an oxidizing agent, or a reducing agent, can be appropriately selected.

[Polishing Treatment]

The polishing treatment carried out using a polishing composition is a step of polishing an object to be polished to form a polished object to be polished. In the polishing treatment, the object to be polished is polished using a polishing apparatus.

The polishing treatment is not particularly limited as long as it polishes an object to be polished, and is preferably a Chemical Mechanical Polishing (CMP) treatment. In addition, the polishing treatment may be a polishing step consisting of a single step or a polishing step consisting of a plurality of steps. Examples of the polishing step consisting of a plurality of steps include a step of carrying out a finish polishing step after a preliminary polishing step (rough polishing step) and a step of carrying out one or two or more secondary polishing steps after a primary polishing step and then carrying out a finish polishing step. The surface treatment using the composition for surface treatment according to the present invention is preferably carried out after the finish polishing step.

As a polishing apparatus, a general polishing apparatus to which a holder for holding an object to be polished, a motor whose rotation speed can be changed, and the like are attached and which has a platen to which a polishing pad (polishing cloth) can be bonded can be used. As the polishing apparatus, either a single-sided polishing apparatus or a double-sided polishing apparatus may be used.

As the polishing pad used in the polishing step according to the present invention, a general non-woven fabric, polyurethane, a porous fluororesin, or the like can be used without particular limitation, and the polishing pad is made of preferably polyurethane for further residue reduction in the surface treatment step.

That is, in the present invention, a component derived from the polishing pad may adhere to the surface of a polished object to be polished. In this case, if the polishing pad is made of polyurethane, the zeta potential of the polyurethane which is a residue adhering to the surface of the polished object to be polished can be controlled to −30 mV or less using the composition for surface treatment according to the present invention, and thereby the residue (polyurethane) can be efficiently removed.

In the surface treatment method of the present invention, the Shore A hardness of the polishing pad used in the polishing treatment is preferably 40° or more and 100° or less. The Shore A hardness of the polishing pad used in the polishing treatment is preferably 40° or more, more preferably 60° or more, further preferably 70° or more, furthermore preferably 75° or more, particularly preferably 80° or more, and most preferably 85° or more. The Shore A hardness of the polishing pad used in the polishing treatment is preferably 100° or less, more preferably 99° or less, further preferably 97° or less, furthermore preferably 95° or less, and particularly preferably 93° or less. When the Shore A hardness of the polishing pad used in the polishing treatment is within the above ranges, the polishing pad and the object to be polished come into contact with each other at an appropriate pressure to provide the following effects: the polishing not only can be carried out efficiently, but also the residue on the surface of the polished object to be polished does not easily remain.

The Shore A hardness of the polishing pad is a value measured based on a type A durometer according to JIS K 6253-3:2012.

The polishing pad is preferably subjected to groove processing such that a polishing liquid can collect.

The polishing conditions are not particularly limited, and for example, the rotation speed of the platen and the head (carrier) rotation speed are preferably 10 rpm (0.17 s$^{-1}$) or more and 100 rpm (1.7 s$^{-1}$) or less, and the pressure (polishing pressure) applied to the object to be polished is preferably 0.5 psi (3.5 kPa) or more and 10 psi (69 kPa) or less. The method for supplying the polishing composition to the polishing pad is not particularly limited either, and for example, a method for continuously supplying (continuously pouring without recycle) the polishing composition using a pump or the like is adopted.

The supply rate is not limited, the surface of the polishing pad is preferably always covered with the polishing composition, and the supply rate is preferably 10 mL/min or more and 5000 mL/min or less. The polishing time is not particularly limited either, and is preferably 5 seconds or more and 180 seconds or less in the step of using the polishing composition.

[Surface Treatment Method]

The present invention is a surface treatment method including treating the surface of a polished object to be polished using the composition for surface treatment.

According to the surface treatment method according to one aspect of the present invention, the residue remaining on the surface of a polished object to be polished can be sufficiently removed. That is, according to another aspect of the present invention, a method for reducing a residue on the surface of a polished object to be polished, including surface-treating the polished object to be polished using the composition for surface treatment, is provided.

The surface treatment method according to one embodiment of the present invention is carried out by a method including contacting the composition for surface treatment according to the present invention directly with a polished object to be polished containing silicon oxide. The surface treatment method is not particularly limited, and examples thereof include a method by a rinse polishing treatment and a method by a cleaning treatment. From this, the surface treatment method according to one embodiment of the present invention is a rinse polishing treatment method or a cleaning treatment method. In addition, the composition for surface treatment according to one embodiment of the present invention is a rinse polishing composition or a cleaning composition. The rinse polishing treatment and the cleaning treatment are carried out in order to remove a foreign substance (a residue such as inorganic oxide abrasive grains or a pad debris, metal contamination, or the like) on the surface of the polished object to be polished to obtain a clean surface.

The composition for surface treatment according to the present invention is particularly suitably used in the rinse polishing treatment. The rinse polishing treatment refers to a treatment that is carried out on a platen to which a polishing pad is attached and that removes a residue on the surface of a polished object to be polished by the frictional force (physical action) of the polishing pad and the action of the composition for surface treatment. Specific examples of the rinse polishing treatment are not particularly limited and include a treatment in which after subjecting an object to be polished to polishing (for example, final polishing or finish polishing), the polished object to be polished and the polishing pad are contacted with each other with the polished object to be polished placed on a platen of a polishing apparatus, and the polished object to be polished and the polishing pad are slid relative to each other while supplying a composition for surface treatment to the contact portion. The rinse polishing treatment may be carried out on the same platen as the platen used for polishing (for example, final polishing or finish polishing) of an object to be polished, or on a platen different from the platen used for the above polishing. Among these, the rinsing polishing treatment is preferably carried out on a platen different from the platen used for polishing (for example, final polishing or finish polishing) of an object to be polished.

The rinse polishing treatment is carried out by contacting the composition for surface treatment according to the present invention directly with a polished object to be polished containing silicon oxide. It is considered that silicon oxide, inorganic oxide abrasive grains, and optionally also polyurethane are negatively charged by the adhesion of the zeta potential adjusting agent by the action of the composition for surface treatment. Then, the frictional force (physical action) of the polishing pad and the action of the composition for surface treatment remove the inorganic oxide abrasive grains and optionally also polyurethane from the surface of the polished object to be polished containing silicon oxide and prevent readhesion thereof. At this time, by utilizing the friction with the polishing pad on the platen (the friction between the polishing pad and a residue), the residue such as inorganic oxide abrasive grains or a pad debris is more effectively removed. Then, after the rinse polishing treatment, a process such as washing with water (post-cleaning treatment described later) is carried out, and thereby the zeta potential adjusting agent on the surface of the polished object to be polished is easily removed. As a result, it is possible to obtain a polished object to be polished containing silicon oxide, in which a residue containing inorganic oxide abrasive grains is remarkably reduced.

The rinse polishing treatment is not particularly limited, and is preferably carried out using a general polishing apparatus to which a holder for holding an object to be polished, a motor whose rotation speed can be changed, and the like are attached and which has a platen to which a polishing pad (polishing cloth) can be bonded can be used. As the polishing apparatus, either a single-sided polishing apparatus or a double-sided polishing apparatus may be used. As the polishing pad, a general non-woven fabric, polyurethane, a porous fluororesin, or the like can be used without particular limitation, and polyurethane is preferable from the viewpoint of further residue reduction. The polishing pad is preferably subjected to groove processing such that a polishing liquid can collect. In addition, when chemical mechanical polishing and the rinse polishing treatment are carried out using the same polishing apparatus, the polishing apparatus preferably includes a discharge nozzle for the composition for surface treatment according to one embodiment of the present invention in addition to a discharge nozzle for the polishing composition.

Here, the treatment conditions are not particularly limited, and for example, the pressure between the polished object to be polished and the polishing pad is preferably 0.5 psi (3.5 kPa) or more and 10 psi (69 kPa) or less. The head rotation speed is preferably 10 rpm ($0.17\ \mathrm{s^{-1}}$) or more and 100 rpm ($1.7\ \mathrm{s^{-1}}$) or less. In addition, the platen rotation speed is preferably 10 rpm ($0.17\ \mathrm{s^{-1}}$) or more and 100 rpm ($1.7\ \mathrm{s^{-1}}$) or less. There is no limitation on the supply rate in continuous pouring without recycle, and the surface of the polished object to be polished is preferably covered with the composition for surface treatment, and is, for example, 10 mL/min or more and 5000 mL/min or less. In addition, the surface treatment time is not particularly limited, and is preferably 5 seconds or more and 180 seconds or less. In the present invention, the increase in the number of residues is also suppressed by the surface treatment for a long time, and thus the surface treatment time is preferably 20 seconds or more, more preferably 30 seconds or more, and further preferably 45 seconds or more. The upper limit of the surface treatment time is usually 5 minutes or less.

The composition for surface treatment according to the present invention is also suitably used in the cleaning treatment. As used herein, the cleaning treatment refers to a treatment that is carried out in a state where the polished object to be polished is detached from the platen and that mainly removes a residue on the surface of the polished object to be polished by the action of the composition for surface treatment. Specific examples of the cleaning treatment include a treatment in which after subjecting an object to be polished to polishing (for example, final polishing or finish polishing) or after carrying out a rinse polishing treatment following the polishing, the polished object to be polished is detached from the platen and contacted with the composition for surface treatment. A unit that applies a frictional force (physical action) to the surface of the polished object to be polished in a state where the composition for surface treatment and the polished object to be polished are in contact with each other may be further used.

The cleaning treatment method is not particularly limited, and examples thereof include a method of immersing an polished object to be polished in a composition for surface treatment and carrying out ultrasonic treatment as necessary, and a method of contacting a cleaning brush and a polished object to be polished with each other while holding the polished object to be polished to scrub the surface of the polished object to be polished using a brush while supplying a composition for surface treatment to the contact portion.

The cleaning treatment apparatus is not particularly limited, and examples thereof include a batch-type cleaning apparatus that simultaneously surface-treats a plurality of polished objects to be polished accommodated in a cassette, a single thin piece-type cleaning apparatus that surface-treats one polished object to be polished attached to a holder, and a polishing apparatus equipped with a cleaning facility that scrubs a polished object to be polished after detached from the platen using a cleaning brush. Here, as the polishing apparatus, a general polishing apparatus having a holder for holding a polished object to be polished, a motor whose rotation speed can be changed, a cleaning brush, and the like can be used. In addition, the cleaning brush is not particularly limited, and examples thereof include a brush made of a resin such as PVA (polyvinyl alcohol).

The cleaning conditions are not particularly limited and can be appropriately set according to the type of the polished object to be polished and the type and amount of the impurity to be removed.

[Post-Cleaning Treatment]

As the surface treatment method according to one embodiment of the present invention, the polished object to be polished may be further subjected to a cleaning treatment after surface treatment. As used herein, this cleaning treatment is referred to as a post-cleaning treatment. Specific examples of the post-cleaning treatment are not particularly limited and include a method of continuously pouring water without recycle over a polished object to be polished after surface treatment, a method of immersing a polished object to be polished after surface treatment in water, and a method of scrubbing a polished object to be polished after surface treatment using a cleaning brush while continuously pouring water without recycle. The method, apparatus, and conditions of the post-cleaning treatment are not particularly limited, and for example, the description of the cleaning treatment can be referred to. Water used for the post-cleaning treatment is not particularly limited, and it is particularly preferable to use deionized water.

By carrying out surface treatment with the composition for surface treatment according to one embodiment of the present invention, the residue is brought into a state of being able to be extremely easily removed. Because of this, by carrying out surface treatment using the composition for surface treatment according to one embodiment of the present invention and then carrying out further cleaning treatment using water, the residue is removed extremely well.

The polished object to be polished after the post-cleaning is preferably dried by throwing out a water droplet adhering to the surface using a spin dryer or the like. In addition, the surface of the polished object to be polished may be dried by air blow drying.

[Method for Producing Semiconductor Substrate]

The surface treatment method of the present invention can be suitably applied when the polished object to be polished is a polished semiconductor substrate. According to another embodiment of the present invention, a method for producing a semiconductor substrate, including treating the surface of a polished object to be polished by the above surface treatment method, wherein the polished object to be polished is a polished semiconductor substrate is also provided.

That is, the method for producing a semiconductor substrate according to the present invention includes a polishing step of obtaining a polished semiconductor substrate by polishing a semiconductor substrate before polishing containing silicon oxide using a polishing composition containing inorganic oxide abrasive grains, wherein the polished semiconductor substrate is a polished object to be polished, and a surface treatment step of reducing a residue containing the inorganic oxide abrasive grains on the surface of the polished semiconductor substrate by the surface treatment method of the present invention.

According to one embodiment of the present invention, in the method for producing a semiconductor substrate, the inorganic oxide abrasive grains contain cerium oxide abrasive grains, and the method includes controlling the zeta potential of the cerium oxide abrasive grains to −30 mV or less using the composition for surface treatment used in the surface treatment step.

According to one embodiment of the present invention, in the method for producing a semiconductor substrate, the polishing step includes using a polishing pad made of polyurethane, the residue further includes the polyurethane, and the method further includes controlling the zeta potential of the polyurethane to −30 mV or less using the composition for surface treatment used in the surface treatment step.

Details of the semiconductor substrate to which such a producing method is applied are as described in the description of the polished object to be polished which is to be surface-treated by the above composition for surface treatment.

In addition, the method for producing a semiconductor substrate is not particularly limited as long as the method includes a step of surface-treating the surface of a polished semiconductor substrate using the composition for surface treatment according to one embodiment of the present invention or surface-treating the same by the surface treatment method according to one embodiment of the present invention (surface treatment step).

[System for Producing Semiconductor Substrate]

The present invention also relates to a system for producing a semiconductor substrate, including an object to be polished containing silicon oxide, a polishing pad, a polishing composition containing inorganic oxide abrasive grains, and the above composition for surface treatment. Accordingly, according to another aspect of the present invention, a system for producing a semiconductor substrate, including an object to be polished containing silicon oxide, a polishing pad, a polishing composition containing cerium oxide abrasive grains, and a composition for surface treatment, wherein a surface of the object to be polished after polishing using the polishing composition and the polishing pad is contacted with the composition for surface treatment is also provided.

Preferable embodiments of the object to be polished containing silicon oxide, the polishing pad, the polishing composition containing inorganic oxide abrasive grains, and the composition for surface treatment which are applied to the system for producing a semiconductor substrate of the present invention are as described above, and thus the description thereof is omitted.

In one embodiment of the present invention, the system for producing a semiconductor substrate may be a system including contacting both sides of a polished object to be polished with the polishing pad and the composition for surface treatment to simultaneously surface-treat both the sides of the polished object to be polished, or a system including contacting only one side of a polished object to be polished with the polishing pad and the composition for surface treatment to surface-treat only the one side of the polished object to be polished. Preferable embodiments of the surface treatment are as described above, and thus the description thereof is omitted.

[Residue Removal Effect]

A higher effect of removing a residue on the surface of a polished object to be polished of the composition for surface treatment according to one aspect of the present invention is more preferable. That is, when surface treatment of the polished object to be polished is carried out using the composition for surface treatment, a smaller number of residues remaining on the surface is more preferable. Specifically, when the polished object to be polished is surface-treated using the composition for surface treatment, the total of residues is preferably 10,000 or less, more preferably 7,000 or less, further more preferably 5,000 or less, particularly preferably 3,000 or less, and particularly preferably 2,000 or less. On the other hand, a smaller total number of residues described above is more preferable, and thus the lower limit thereof is not particularly limited and is substantially 100 or more.

In addition, when the polished object to be polished is surface-treated using the composition for surface treatment, the number of abrasive grain residues is preferably 6,000 or less, more preferably 4,000 or less, further preferably 3,500 or less, furthermore preferably 2,500 or less, and particularly preferably 2,000 or less. On the other hand, a smaller number of abrasive grain residues described above is more preferable, and thus the lower limit thereof is not particularly limited and is 50 or more, for example.

Then, when the polished object to be polished is surface-treated using the composition for surface treatment, the number of polyurethane residues is preferably 4,000 or less, more preferably 3,000 or less, further preferably 2,500 or less, and particularly preferably 1,500 or less. On the other hand, a smaller number of polyurethane residues described above is more preferable, and thus the lower limit thereof is not particularly limited and is 50 or more, for example.

As each of the above numbers of various residues, the value measured by the method described in Examples after surface treatment is carried out by the method described in Examples is adopted.

Embodiments of the present invention have been described in detail, but these are descriptive and illustrative and are not limiting, and it is clear that the scope of the invention should be construed by the appended claims.

The present invention encompasses the following aspects and embodiments.

[1] A surface treatment method for reducing a residue containing inorganic oxide abrasive grains on a surface of a polished object to be polished containing silicon oxide using a composition for surface treatment, wherein
the composition for surface treatment contains a zeta potential adjusting agent having an sp value of more than 9 and 11 or less and having a negatively charged functional group and a dispersing medium, and the surface treatment method includes negatively controlling a zeta potential of the silicon oxide and controlling a zeta potential of the inorganic oxide abrasive grains to −30 mV or less using the composition for surface treatment.

[2] The surface treatment method according to [1] above, wherein the inorganic oxide abrasive grains contain cerium oxide abrasive grains, and a zeta potential of the cerium oxide abrasive grains is controlled to −30 mV or less using the composition for surface treatment.

[3] The surface treatment method according to [1] or [2] above, wherein the residue further contains polyurethane, and the surface treatment method further includes controlling a zeta potential of the polyurethane to −30 mV or less using the composition for surface treatment.

[4] The surface treatment method according to any one of [1] to [3] above, wherein the zeta potential adjusting agent is an anionic surfactant having a molecular weight of less than 1,000.

[5] The surface treatment method according to [4] above, wherein the anionic surfactant has at least one functional group selected from the group consisting of a sulfonic acid (salt) group, a sulfuric acid (salt) group, a phosphonic acid (salt) group, and a phosphoric acid (salt) group.

[6] The surface treatment method according to any one of [1] to [5] above, wherein the composition for surface treatment further contains a pH adjusting agent.

[7] The surface treatment method according to any one of [1] to [6] above, wherein a pH value of the composition for surface treatment is 2 or more and less than 5.

[8] The surface treatment method according to any one of [1] to [7] above, wherein the surface treatment method is a rinse polishing treatment method or a cleaning treatment method.

[9] A method for producing a semiconductor substrate, including:
a polishing step of obtaining a polished semiconductor substrate by polishing a semiconductor substrate before polishing containing silicon oxide using a polishing composition containing inorganic oxide abrasive grains, wherein
the polished semiconductor substrate is a polished object to be polished, and
a surface treatment step of reducing a residue containing the inorganic oxide abrasive grains on a surface of the polished semiconductor substrate by the surface treatment method according to any one of claims 1 to 8.

[10] The method for producing a semiconductor substrate according to [9] above, wherein
the inorganic oxide abrasive grains contain cerium oxide abrasive grains, and
the method includes controlling the zeta potential of the cerium oxide abrasive grains to −30 mV or less using the composition for surface treatment used in the surface treatment step.

[11] The method for producing a semiconductor substrate according to [9] or [10] above, wherein
the polishing step includes using a polishing pad made of polyurethane,
the residue further contains the polyurethane, and
the method further includes controlling a zeta potential of the polyurethane to −30 mV or less using the composition for surface treatment used in the surface treatment step.

[12] The method for producing a semiconductor substrate according to [11] above, wherein a Shore A hardness of the polishing pad is 40° or more and 100° or less.

[13] A composition for surface treatment used for reducing a residue containing inorganic oxide abrasive grains on a surface of a polished object to be polished containing silicon oxide,
the composition for surface treatment containing a zeta potential adjusting agent having an sp value of more than 9 and 11 or less and having a negatively charged functional group and a dispersing medium, and
having a function of negatively controlling a zeta potential of the silicon oxide and controlling a zeta potential of the inorganic oxide abrasive grains to −30 mV or less.

[14] The composition for surface treatment according to [13] above, wherein
the inorganic oxide abrasive grains contain cerium oxide abrasive grains, and
the composition for surface treatment has a function of controlling a zeta potential of the cerium oxide abrasive grains to −30 mV or less.

[15] The composition for surface treatment according to [13] or [14] above, wherein
the residue further contains polyurethane, and
the composition for surface treatment further has a function of controlling a zeta potential of the polyurethane to −30 mV or less.

[16] The composition for surface treatment according to any one of [13] to [15] above, wherein the composition for surface treatment is a rinse polishing composition or a cleaning composition.

[17] A system for producing a semiconductor substrate, including an object to be polished containing silicon oxide, a polishing pad, a polishing composition containing inorganic oxide abrasive grains, and the composition for surface treatment according to any one of [13] to [16] above, wherein
a surface of the object to be polished after polishing using the polishing composition and the polishing pad is contacted with the composition for surface treatment.

EXAMPLES

The present invention will be described in more detail with reference to the following Examples and Comparative Examples. However, the technical scope of the present invention is not limited only to the following Examples. Unless otherwise specified, "%" and "parts" mean "% by mass" and "parts by mass," respectively. In addition, in the following Examples, unless otherwise specified, the operations were carried out under conditions of room temperature (20 to 25° C.)/a relative humidity of 40 to 50% RH. Further, in the following Examples, the "TEOS substrate" means a substrate having a silicon oxide film generated by using tetraethyl orthosilicate as a precursor.

[Preparation of Compositions for Surface Treatment]
[Preparation of Composition for Surface Treatment A1]
Ammonium POE allyl phenyl ether sulfate (product name: HITENOL (registered trademark, the same applies hereinafter) NF08, manufactured by DKS Co., Ltd.) as a zeta potential adjusting agent, nitric acid as a pH adjusting agent, and water (deionized water) as a dispersing medium were mixed with the entire composition as 100 parts by mass to prepare composition for surface treatment A1. The amount (content) of the zeta potential adjusting agent added was 0.1 g/kg based on the total mass of composition for surface treatment A1, and the amount (content) of the pH adjusting agent added was an amount that caused the pH of composition for surface treatment A1 to be 3 (liquid temperature: 25° C.). The pH was measured using a pH meter (product name: LAQUA (registered trademark) manufactured by HORIBA, Ltd.).

[Preparation of Compositions for Surface Treatment A2 to A6]

Compositions for surface treatment A2 to A6 were each prepared in the same manner as in the preparation of composition for surface treatment A1 except that the type of the zeta potential adjusting agent was changed as shown in Table 1 below and the amount of the pH adjusting agent was changed such that the pH of the resulting composition for surface treatment was the pH shown in Table 1 below.

[Preparation of Compositions for Surface Treatment B1 to B9]

Compositions for surface treatment B1 to B9 were each prepared in the same manner as in the preparation of composition for surface treatment A1, except that using the zeta potential adjusting agent or the additive shown in Table 1 (a compound used instead of the zeta potential adjusting agent is referred to as an additive), the type and content of the zeta potential adjusting agent or the additive were changed as shown in Table 1 below, and the amount of the pH adjusting agent was changed such that the pH of the resulting composition for surface treatment was the pH shown in Table 1 below.

Compositions for surface treatment A1 to A6 are the compositions for surface treatment used in the Examples, and compositions for surface treatment B1 to B9 are the compositions for surface treatment used in the Comparative Examples.

Details of the zeta potential adjusting agents and the additives used in compositions for surface treatment A1 to A6 and B1 to B9 are shown below. Table 1 shows the sp values of the zeta potential adjusting agents and the additives used. The sp value is a value calculated by the Fedors method (Reference: R. F. Fedors, Polym. Eng. Sci., 14[2] 147 (1974)).

Ammonium POE allyl phenyl ether sulfate, manufactured by DKS Co., Ltd., product number: HITENOL NF08 (EO=10)

Alkyl diphenyl ether disulfonic acid salt, manufactured by TAKEMOTO OIL & FAT Co., Ltd., product number: PIONIN A-43-S(alkyl=C12)

POE allyl phenyl ether phosphate amine salt, manufactured by TAKEMOTO OIL & FAT Co., Ltd., product number: NEWKALGEN FS-3AQ (mixture of EO=3 to 10)

Ammonium lauryl sulfate, manufactured by Kao Corporation, product number: EMAL AS-25R Na lauryl glycol carboxylate, manufactured by Sanyo Chemical Industries, Ltd., product number: BEAULIGHT SHAA Na polyoxyethylene tridecyl ether acetate, manufactured by Nikko Chemicals Co., Ltd., product number: NIKKOL ECTD-3NEX 2Na 3-amino-1,5-naphthalenedisulfonate Polyvinyl alcohol (PVA), Mw=10,000: manufactured by Japan VAM & POVAL Co., Ltd., product number: JMR-10HH Polyglycerin lauryl ether (PGLE), Mw=2,000: manufactured by Daicel Corporation, product number: CELMOLLIS (registered trademark) B044 (20 glycerin icosamer)

POE lauryl ether, manufactured by Nihon Emulsion Co., Ltd., product number: EMALEX 709 (EO=9).

Examples 1 to 24, Comparative Examples 1 to 27, and Reference Examples 1 to 5

In order to evaluate the performance of compositions for surface treatment A1 to A6 and B1 to B9 obtained, an object to be polished was subjected to a CMP step, and the polished object to be polished obtained through the CMP step was subjected to a rinse polishing step, as follows. The rinse polishing step is carried out using the above compositions for surface treatment A1 to A6 and B1 to B9.

[CMP Step]

First, an object to be polished was subjected to a CMP step. The object to be polished was a TEOS substrate or a SiN substrate, and the following two polishing compositions were provided.

[Polishing Compositions]

Polishing composition C1 (polishing composition using $CeO_2$ abrasive grains as abrasive grains) Colloidal ceria (HC30 manufactured by Solvay S.A.) (average primary particle size: 30 nm, average secondary particle size: 70 nm, 30 wt % aqueous dispersion): 1% by mass Ammonium polyacrylate (Aron A-30SL manufactured by Toagosei Co., Ltd.) (Mw: 6,000, 40% aqueous solution): 0.6% by mass 30% Maleic acid aqueous solution (manufactured by Kanto Chemical Co., Inc.): 0.2% by mass Water: Balance (Adjusted to pH 4).

Polishing composition C2 (polishing composition using $SiO_2$ abrasive grains as abrasive grains)

Anion-modified colloidal silica (sulfonic acid-modified colloidal silica prepared by the method described in "Sulfonic acid-functionalized silica through quantitative oxidation of thiol groups", Chem. Commun. 246-247 (2003)) (average primary particle size: 35 nm, average secondary particle size: 70 nm): 2% by mass 30% Maleic acid aqueous solution (manufactured by Kanto Chemical Co., Inc.): 0.002% by mass Ammonium sulfate (manufactured by Kanto Chemical Co., Inc.): 0.25% by mass Water: Balance (Adjusted to pH 3).

[CMP Step]

A TEOS substrate or a SiN substrate, which is a semiconductor substrate, as an object to be polished was polished using each of the polishing compositions under the following conditions. Here, as the TEOS substrate, a 300 mm wafer was used, and as the SiN substrate, a 300 mm wafer was used;

TEOS substrate (300 mm wafer, manufactured by Advantec Co., Ltd., product number: 300 mm P-TEOS 10000Å)

SiN substrate (300 mm wafer, manufactured by Advantec Co., Ltd., product number: (CVD-)LP-SiN 2500Å)

—Polishing Apparatus and Polishing Conditions—

Polishing apparatus: FREX300E manufactured by Ebara Corporation

Polishing pad: One of the following was used

Foamed polyurethane pad H800-Type 1 (Shore A hardness: 89.4°) manufactured by Fujibo Holdings, Inc.

Foamed polyurethane pad H800-CZM (Shore A hardness: 78.9°) manufactured by Fujibo Holdings, Inc.

Foamed polyurethane pad X400-CZM (Shore A hardness: 76.3°) manufactured by Fujibo Holdings, Inc.

Conditioner (Dresser): Nylon brush (manufactured by 3M)

Polishing pressure: 2.0 psi (1 psi=6894.76 Pa)

Platen rotation speed: 80 rpm

Head rotation speed: 80 rpm

Supply of polishing composition: continuous pouring without recycle

Supply rate of polishing composition: 200 mL/min

Polishing time: 30 seconds.

[Rinse Polishing Treatment Step]

After polishing the surface of the TEOS substrate in the above CMP step, the polished TEOS substrate was dismounted from the platen as a polished object to be polished. Subsequently, within the same polishing apparatus, the polished TEOS substrate was mounted on another platen, and compositions for surface treatment A1 to A6 and B1 to B9 prepared above were used to subject the surface of the polished TEOS substrate to a rinse polishing treatment under the following conditions;

—Rinse Polishing Apparatus and Rinse Polishing Conditions—

Polishing pressure: 1.0 psi

Platen rotation speed: 60 rpm

Head rotation speed: 60 rpm

Supply of polishing composition: continuous pouring without recycle

Supply rate of composition for surface treatment: 300 mL/min

Polishing time: 60 seconds.

After the rinse polishing treatment, the surface of the substrate was brush-washed using deionized water for 60 seconds to obtain a rinse-polished polished TEOS substrate.

<Evaluations>

The following items were measured and evaluated for each polished TEOS substrate after the above rinse polishing step. Evaluation results are shown in Table 2 to Table 6.

Table 2 shows "evaluation results (Examples 1 to 6 and Comparative Examples 1 to 9) of each of compositions for surface treatment A1 to A6 and B1 to B9 for the polished TEOS substrate" obtained by polishing the TEOS substrate (object to be polished) using polishing composition C1 and using H800-Type 1 as the polishing pad in the polishing step.

Table 3 shows "evaluation results (Examples 7 to 12 and Comparative Examples 10 to 18) of each of compositions for surface treatment A1 to A6 and B1 to B9 for the polished TEOS substrate" obtained by polishing the TEOS substrate (object to be polished) using polishing composition C1 and using H800-CZM as the polishing pad in the polishing step.

Table 4 shows "evaluation results (Examples 13 to 18 and Comparative Examples 19 to 27) of each of compositions for surface treatment A1 to A6 and B1 to B9 for the polished TEOS substrate" obtained by polishing the TEOS substrate (object to be polished) using polishing composition C1 and using X400-CZM as the polishing pad in the polishing step.

Table 5 shows "evaluation results (Examples 19 to 24) of each of compositions for surface treatment A1 to A6 for the polished TEOS substrate" obtained by polishing the TEOS substrate (object to be polished) using polishing composition C2 and using H800-Type 1 as the polishing pad in the polishing step.

Table 6 shows "evaluation results (Reference Examples 1 to 5) of each of compositions for surface treatment A1 to A5 for the polished SiN substrate" obtained by polishing the SiN substrate (object to be polished) using polishing composition C1 and using H800-Type 1 as the polishing pad in the polishing step. The SiN substrate (polishing object) was also subjected to the same rinse polishing treatment under the same rinse conditions as the polished TEOS substrate. In Table 6, evaluation results of the polished TEOS substrate under the same conditions are also shown together. These Reference Examples are for testing whether or not the composition for surface treatment of the present invention can also exert the effect of the present invention on a SiN substrate, and are intended to test whether or not the composition for surface treatment of the present invention can be suitably used even when the polished object to be polished contains silicon oxide and silicon nitride.

[Evaluation of Total Number of Residues]

For the total number of residues, the number of residues on the surface of the polished TEOS substrate after the rinse polishing treatment was evaluated using an optical inspection machine Surfscan (registered trademark) SP5 manufactured by KLA-Tencor Corporation. Specifically, the number of residues having a diameter of more than 50 μm was counted in the remaining portion after excluding the portion having a width of 5 mm inward from the outer peripheral end portion of one side of the polished TEOS substrate (the portion from a width of 0 mm to a width of 5 mm with the outer peripheral end portion as 0 mm). A smaller number of residues is more preferable. Results thereof are shown in Table 2 to Table 6 below. If the total number of residues exceeds 10,000, the number cannot be detected, and thus ">10,000" is indicated in Table 2 to Table 6.

[Evaluation of Number of Abrasive Grain Residues and Number of Polyurethane Residues]

For the polished TEOS substrate after the above rinse polishing treatment, the number of abrasive grain residues and the number of polyurethane residues were measured by SEM observation using Review SEM RS6000 manufactured by Hitachi High-Tech Corporation. First, 100 residues present in the remaining portion after excluding the portion having a width of 5 mm inward from the outer peripheral end portion of one side of the polished object to be polished were sampled by SEM observation. Next, among the 100 residues sampled, the types of the residues (abrasive grain or polyurethane) were determined by visual SEM observation, and the number of abrasive grains ($CeO_2$ or $SiO_2$) and the number of polyurethane were checked to calculate the proportion (%) of the abrasive grain residues and the proportion (%) of the polyurethane residues, respectively, in the residues. Then, the product of the total number (residues) of residues having a diameter of more than 50 μm measured by the above evaluation of the total number of residues and the proportion (%) of the abrasive grain residues in the residues calculated by SEM observation was calculated as the number (residues) of abrasive grain residues. In addition, the product of the total number (residues) of residues having a diameter of more than 50 μm measured by the above evaluation of the total number of residues and the proportion (%) of the polyurethane residues in the residues calculated by SEM observation was calculated as the number (residues) of polyurethane residues.

In Table 2 to Table 6, the "Number of abrasive grain residues" represents residues of inorganic oxide abrasive grains ($CeO_2$ abrasive grain residues or $SiO_2$ abrasive grain residues), and the "Number of polyurethane residues" represents residues of the polishing pad. When the total number of residues exceeded 10,000, the number of abrasive grain residues and the number of the polyurethane residues in the residues were unable to be calculated. It is considered that the great majority of the residues are abrasive grain residues, and thus in Table 2 to Table 6, when the total number of residues exceeds 10,000, the number of abrasive grain residues is indicated as ">10,000," and the number of polyurethane residues is indicated as "_."

[Zeta Potential Measurement]
[Measurement of Zeta Potential of Inorganic Oxide Abrasive Grains]

The zeta potential of the inorganic oxide abrasive grains is a value measured by Zetasizer Nano ZSP manufactured by Spectris Co., Ltd. (Malvern Division). The zeta potential of the $CeO_2$ abrasive grains being rinse-polished using the composition for surface treatment and the zeta potential of the anion-modified $SiO_2$ abrasive grains being rinse-polished using the composition for surface treatment were values measured by the following model experiments, respectively. These values are shown in Table 1 to Table 6 below.

($CeO_2$ Abrasive Grains)

A $CeO_2$ particle dispersion (HC30 manufactured by Solvay S.A., 30% by mass aqueous dispersion of colloidal ceria having average primary particle size: 30 nm and average secondary particle size: 60 nm) was added to the composition for surface treatment prepared above to prepare a measurement liquid having a $CeO_2$ particle concentration of 0.02% by mass (the content of the $CeO_2$ particle in the measurement liquid was 0.02% by mass based on the total mass of the measurement liquid). A measurement-dedicated cell of the above apparatus (Zetasizer Nano ZSP) was filled with the obtained measurement liquid, and the zeta potential of the $CeO_2$ abrasive grains was measured.

(Anion-Modified $SiO_2$ Abrasive Grains)

An anion-modified $SiO_2$ particle dispersion (19.5% by mass aqueous dispersion of anion-modified colloidal silica (sulfonic acid-modified colloidal silica prepared by the method described in "Sulfonic acid-functionalized silica through quantitative oxidation of thiol groups", Chem. Commun. 246-247 (2003), average primary particle size: 35 nm, average secondary particle size: 70 nm)) was added to the composition for surface treatment prepared above to prepare a measurement liquid having an anion-modified $SiO_2$ particle concentration of 0.02% by mass (the content of the anion-modified $SiO_2$ particle in the measurement liquid was 0.02% by mass based on the total mass of the measurement liquid). A measurement-dedicated cell of the above apparatus (Zetasizer Nano ZSP) was filled with the obtained measurement liquid, and the zeta potential of the anion-modified $SiO_2$ abrasive grains was measured.

[Measurement of Zeta Potentials of Polished TEOS Substrate, Polished SiN Substrate, and Polyurethane]

The zeta potential of the polished TEOS substrate and the zeta potential of polyurethane are each a value measured by a solid zeta potential measuring instrument SurPASS 3 manufactured by Anton Paar Japan K.K. The zeta potential of the surface of the polished TEOS substrate being rinse-polished using the composition for surface treatment, the zeta potential of the surface of the polished SiN substrate, and the zeta potential of polyurethane being rinse-polished using the composition for surface treatment were values measured by the following model experiments, respectively. These values are shown in Table 1 below.

For the zeta potential of polyurethane, a polyurethane pad (foamed polyurethane pad H800-Type 1 manufactured by Fujibo Holdings, Inc.) cut into a square of 60 mm per side was used as an object to be measured.

For the zeta potential of the surface of the polished TEOS substrate, a TEOS substrate (300 mm wafer, manufactured by Advantec Co., Ltd., product number: 300 mm P-TEOS 10000A) cut into a square of 60 mm per side was used as an object to be measured. For the zeta potential of the surface of the polished SiN substrate, a SiN substrate (300 mm wafer, manufactured by Advantec Co., Ltd., product number: (CVD-)LP-SiN 2500A) cut into a square of 60 mm per side was used as an object to be measured.

These objects to be measured was each placed on a zeta potential meter. Next, the composition for surface treatment prepared above was passed through the objects to be measured, and the zeta potentials of these objects to be measured were each measured.

TABLE 1

| | Configurations of compositions for surface treatment | | | | | | | |
|---|---|---|---|---|---|---|---|---|
| | Composition for surface treatment | | | | Zeta potentials in surface treatment composition [mV] | | | |
| | Zeta potential adjusting agent or additive | | | | Inorganic oxide abrasive grains | | | Polished object |
| | Compound | sp Value | Concentration [g/kg] | pH | $CeO_2$ | Anion-modified $SiO_2$ | Polishing pad Polyurethane | to be polished $SiO_2$ |
| Composition for surface treatment A1 | Ammonium POE allyl phenyl ether sulfate | 10 | 0.1 | 3 | −48.4 | −45.0 | −68.6 | −17.0 |
| Composition for surface treatment A2 | Alkyl diphenyl ether disulfonic acid salt | 10 | 0.1 | 3 | −51.2 | −44.0 | −61.3 | −4.3 |
| Composition for surface treatment A3 | POE allyl phenyl ether phosphate amine salt | 11 | 0.1 | 3 | −36.8 | −48.0 | −42.6 | −38.1 |
| Composition for surface treatment A4 | Ammonium lauryl sulfate | 10 | 0.1 | 3 | −53.9 | −45.0 | −64.6 | −9.6 |
| Composition for surface treatment A5 | POE allyl phenyl ether phosphate amine salt | 11 | 0.1 | 2 | −35.0 | −40.0 | −41.0 | −39.0 |
| Composition for surface treatment A6 | POE allyl phenyl ether phosphate amine salt | 11 | 0.1 | 4 | −33.0 | −44.0 | −10.0 | −21.0 |
| Composition for surface treatment B1 | POE allyl phenyl ether phosphate amine salt | 11 | 0.1 | 5 | −0.8 | −42.0 | 0.2 | −10.0 |
| Composition for surface treatment B2 | — | — | — | 3 | 36.8 | −40.0 | 8.2 | 0.4 |

TABLE 1-continued

Configurations of compositions for surface treatment

| | Composition for surface treatment | | | | Zeta potentials in surface treatment composition [mV] | | | |
|---|---|---|---|---|---|---|---|---|
| | Zeta potential adjusting agent or additive | | | | Inorganic oxide abrasive grains | | | Polished object |
| | Compound | sp Value | Concentration [g/kg] | pH | $CeO_2$ | Anion-modified $SiO_2$ | Polishing pad Polyurethane | to be polished $SiO_2$ |
| Composition for surface treatment B3 | Na lauryl glycol carboxylate | 11 | 0.1 | 3 | −2.1 | −45.0 | 1.1 | 0.3 |
| Composition for surface treatment B4 | Na polyoxyethylene tridecyl ether acetate | 9 | 0.1 | 3 | −3.6 | −39.0 | 0.2 | −2.1 |
| Composition for surface treatment B5 | 2Na 3-amino-1,5-naphthalenedisulfonate | 7 | 0.1 | 3 | −1.3 | −41.0 | −0.9 | −5.1 |
| Composition for surface treatment B6 | PVA | 18 | 1.0 | 3 | −0.2 | −44.0 | −6.8 | −0.5 |
| Composition for surface treatment B7 | Polyglycerin lauryl ether | 19 | 0.1 | 3 | 26.1 | −41.0 | −11.0 | 0.2 |
| Composition for surface treatment B8 | POE alkyl ether | 9 | 1.0 | 3 | 35.1 | −46.0 | 10.4 | 2.8 |
| Composition for surface treatment B9 | Sorbitan lauric acid ester | 12 | 1.0 | 3 | 34.5 | −46.0 | 9.4 | 1.6 |

TABLE 2

Evaluation results of compositions for surface treatment (polishing composition C1/polishing pad H800-Type 1)

| | CMP step conditions; Polishing composition C1 Polishing pad H800-Type 1 | Zeta potentials in surface treatment composition [mV] | | | Evaluation results | | |
|---|---|---|---|---|---|---|---|
| | | Abrasion grains $CeO_2$ | Polishing pad Polyurethane | Polished object to be polished $SiO_2$ | Total number of residues [residues] | Number of abrasion grain residues ($CeO_2$) [residues] | Number of polyurethane residues (Polishing pad) [residues] |
| Example 1 | Composition for surface treatment A1 | −48.4 | −68.6 | −17.0 | 1818 | 1500 | 318 |
| Example 2 | Composition for surface treatment A2 | −51.2 | −61.3 | −4.3 | 3963 | 3300 | 663 |
| Example 3 | Composition for surface treatment A3 | −36.8 | −42.6 | −38.1 | 1470 | 1200 | 270 |
| Example 4 | Composition for surface treatment A4 | −53.9 | −64.6 | −9.6 | 3750 | 3300 | 450 |
| Example 5 | Composition for surface treatment A5 | −35.0 | −41.0 | −39.0 | 1669 | 1224 | 445 |
| Example 6 | Composition for surface treatment A6 | −33.0 | −10.0 | −21.0 | 2690 | 2090 | 600 |
| Comparative Example 1 | Composition for surface treatment B1 | −0.8 | 0.2 | −10.0 | 9978 | 8071 | 1907 |
| Comparative Example 2 | Composition for surface treatment B2 | 36.8 | 8.2 | 0.4 | >10000 | >10000 | — |
| Comparative Example 3 | Composition for surface treatment B3 | −2.1 | 1.1 | 0.3 | >10000 | >10000 | — |
| Comparative Example 4 | Composition for surface treatment B4 | −3.6 | 0.2 | −2.1 | >10000 | >10000 | — |
| Comparative Example 5 | Composition for surface treatment B5 | −1.3 | −0.9 | −5.1 | >10000 | >10000 | — |
| Comparative Example 6 | Composition for surface treatment B6 | −0.2 | −6.8 | −0.5 | >10000 | >10000 | — |
| Comparative Example 7 | Composition for surface treatment B7 | 26.1 | −11.0 | 0.2 | >10000 | >10000 | — |
| Comparative Example 8 | Composition for surface treatment B8 | 35.1 | 10.4 | 2.8 | >10000 | >10000 | — |
| Comparative Example 9 | Composition for surface treatment B9 | 34.5 | 9.4 | 1.6 | >10000 | >10000 | — |

TABLE 3

Evaluation results of compositions for surface treatment (polishing composition C1/polishing pad H800-CZM)

| CMP step conditions; Polishing composition C1 Polishing pad H800-CZM | | Zeta potentials in surface treatment composition [mV] | | | Evaluation results | | |
|---|---|---|---|---|---|---|---|
| | | Abrasion grains $CeO_2$ | Polishing pad Polyurethane | Polished object to be polished $SiO_2$ | Total number of residues [residues] | Number of abrasion grain residues ($CeO_2$) [residues] | Number of polyurethane residues (Polishing pad) [residues] |
| Example 7 | Composition for surface treatment A1 | −48.4 | −68.6 | −17.0 | 2226 | 1834 | 392 |
| Example 8 | Composition for surface treatment A2 | −51.2 | −61.3 | −4.3 | 3893 | 2992 | 901 |
| Example 9 | Composition for surface treatment A3 | −36.8 | −42.6 | −38.1 | 2289 | 1843 | 446 |
| Example 10 | Composition for surface treatment A4 | −53.9 | −64.6 | −9.6 | 4071 | 3163 | 908 |
| Example 11 | Composition for surface treatment A5 | −35.0 | −41.0 | −39.0 | 1104 | 998 | 106 |
| Example 12 | Composition for surface treatment A6 | −33.0 | −10.0 | −21.0 | 2013 | 1810 | 203 |
| Comparative Example 10 | Composition for surface treatment B1 | −0.8 | 0.2 | −10.0 | 9010 | 7002 | 2008 |
| Comparative Example 11 | Composition for surface treatment B2 | 36.8 | 8.2 | 0.4 | >10000 | >10000 | — |
| Comparative Example 12 | Composition for surface treatment B3 | −2.1 | 1.1 | 0.3 | >10000 | >10000 | — |
| Comparative Example 13 | Composition for surface treatment B4 | −3.6 | 0.2 | −2.1 | >10000 | >10000 | — |
| Comparative Example 14 | Composition for surface treatment B5 | −1.3 | −0.9 | −5.1 | >10000 | >10000 | — |
| Comparative Example 15 | Composition for surface treatment B6 | −0.2 | −6.8 | −0.5 | >10000 | >10000 | — |
| Comparative Example 16 | Composition for surface treatment B7 | 26.1 | −11.0 | 0.2 | >10000 | >10000 | — |
| Comparative Example 17 | Composition for surface treatment B8 | 35.1 | 10.4 | 2.8 | >10000 | >10000 | — |
| Comparative Example 18 | Composition for surface treatment B9 | 34.5 | 9.4 | 1.6 | >10000 | >10000 | — |

TABLE 4

Evaluation results of compositions for surface treatment (polishing composition C1/polishing pad X400-CZM)

| CMP step conditions; Polishing composition C1 Polishing pad X400-CZM | | Zeta potentials in surface treatment composition [mV] | | | Evaluation results | | |
|---|---|---|---|---|---|---|---|
| | | Abrasion grains $CeO_2$ | Polishing pad Polyurethane | Polished object to be polished $SiO_2$ | Total number of residues [residues] | Number of abrasion grain residues ($CeO_2$) [residues] | Number of polyurethane residues [Polishing pad] [residues] |
| Example 13 | Composition for surface treatment A1 | −48.4 | −68.6 | −17.0 | 1930 | 1724 | 206 |
| Example 14 | Composition for surface treatment A2 | −51.2 | −61.3 | −4.3 | 4080 | 3359 | 721 |
| Example 15 | Composition for surface treatment A3 | −36.8 | −42.6 | −38.1 | 2001 | 1796 | 205 |
| Example 16 | Composition for surface treatment A4 | −53.9 | −64.6 | −9.6 | 3952 | 2,928 | 1,024 |
| Example 17 | Composition for surface treatment A5 | −35.0 | −41.0 | −39.0 | 1020 | 803 | 217 |
| Example 18 | Composition for surface treatment A6 | −33.0 | −10.0 | −21.0 | 1603 | 998 | 605 |
| Comparative Example 19 | Composition for surface treatment B1 | −0.8 | 0.2 | −10.0 | >10000 | >10000 | — |
| Comparative Example 20 | Composition for surface treatment B2 | 36.8 | 8.2 | 0.4 | >10000 | >10000 | — |
| Comparative Example 21 | Composition for surface treatment B3 | −2.1 | 1.1 | 0.3 | >10000 | >10000 | — |
| Comparative Example 22 | Composition for surface treatment B4 | −3.6 | 0.2 | −2.1 | >10000 | >10000 | — |
| Comparative Example 23 | Composition for surface treatment B5 | −1.3 | −0.9 | −5.1 | >10000 | >10000 | — |
| Comparative Example 24 | Composition for surface treatment B6 | −0.2 | −6.8 | −0.5 | >10000 | >10000 | — |

TABLE 4-continued

Evaluation results of compositions for surface treatment (polishing composition C1/polishing pad X400-CZM)

| CMP step conditions; Polishing composition C1 Polishing pad X400-CZM | | Zeta potentials in surface treatment composition [mV] | | | Evaluation results | | |
|---|---|---|---|---|---|---|---|
| | | Abrasion grains $CeO_2$ | Polishing pad Polyurethane | Polished object to be polished $SiO_2$ | Total number of residues [residues] | Number of abrasion grain residues ($CeO_2$) [residues] | Number of polyurethane residues [Polishing pad) [residues] |
| Comparative Example 25 | Composition for surface treatment B7 | 26.1 | −11.0 | 0.2 | >10000 | >10000 | — |
| Comparative Example 26 | Composition for surface treatment B8 | 35.1 | 10.4 | 2.8 | >10000 | >10000 | — |
| Comparative Example 27 | Composition for surface treatment B9 | 34.5 | 9.4 | 1.6 | >10000 | >10000 | — |

TABLE 5

Evaluation results of compositions for surface treatment (polishing composition C2/polishing pad H800-Type 1)

| CMP step conditions; Polishing composition C2 Polishing pad H800-Type 1 | | Zeta potentials in surface treatment composition [mV] | | | Evaluation results | | |
|---|---|---|---|---|---|---|---|
| | | Abrasion grains Anion-modified $SiO_2$ | Polishing pad Polyurethane | Polished object to be polished $SiO_2$ | Total number of residues [residues] | Number of abrasion grain residues ($SiO_2$) [residues] | Number of polyurethane residues (Polishing pad) [residues] |
| Example 19 | Composition for surface treatment A1 | −45.0 | −68.6 | −17.0 | 2163 | 980 | 1183 |
| Example 20 | Composition for surface treatment A2 | −44.0 | −61.3 | −4.3 | 5736 | 2548 | 3188 |
| Example 21 | Composition for surface treatment A3 | −48.0 | −42.6 | −38.1 | 1236 | 600 | 636 |
| Example 22 | Composition for surface treatment A4 | −45.0 | −64.6 | −9.6 | 6698 | 3146 | 3552 |
| Example 23 | Composition for surface treatment A5 | −40.0 | −41.0 | −39.0 | 1962 | 960 | 1002 |
| Example 24 | Composition for surface treatment A6 | −44.0 | −10.0 | −21.0 | 2880 | 1860 | 1020 |

TABLE 6

Evaluation results of compositions for surface treatment (polishing composition C1/polishing pad H800-Type 1/polished object to be polished: SiN)

| CMP step conditions; Polishing composition C1 Polishing pad H800-Type 1 Object to be polished: SiN | | Zeta potentials in surface treatment composition [mV] | | | | Polishing composition (abrasion grains: $CeO_2$)/Pad: H800-Type 1 | |
|---|---|---|---|---|---|---|---|
| | | Inorganic oxide abrasive grains $CeO_2$ | Polishing pad Polyurethane | Polished object to be polished $SiO_2$ | SiN | Polished object to be polished $SiO_2$ Total number of residues [residues] | Polished object to be polished SiN Total number of residues [residues] |
| Reference Example 1 | Composition for surface treatment A1 | −48.4 | −68.6 | −17.0 | −50.4 | 1818 | 353 |
| Reference Example 2 | Composition for surface treatment A2 | −51.2 | −61.3 | −4.3 | −45.6 | 3963 | 298 |
| Reference Example 3 | Composition for surface treatment A3 | −36.8 | −42.6 | −38.1 | −40.2 | 1470 | 714 |
| Reference Example 4 | Composition for surface treatment A4 | −53.9 | −64.6 | −9.6 | −44.5 | 3750 | 399 |
| Reference Example 5 | Composition for surface treatment A5 | −35.0 | −41.0 | −39.0 | −2.4 | 1669 | 211 |

As shown in Table 2 to Table 4, it was found that in Examples 1 to 18, after the TEOS substrate was polished using polishing composition C1 (that is, the polishing composition using cerium oxide abrasive grains as abrasive grains), the rinse polishing of the polished TEOS substrate using each of compositions for surface treatment A1 to A6 remarkably reduced the residues (total number of residues) on the polished TEOS substrate. In addition, as shown in Table 5, it was found that in Examples 19 to 24, even when the TEOS substrate was polished using polishing composition C2 (that is, the polishing composition using anion-modified colloidal silica abrasive grains as abrasive grains), the rinse polishing of the polished TEOS substrate using each of compositions for surface treatment A1 to A6 remarkably reduced the residues (total number of residues) on the polished TEOS substrate.

In Table 6, the residue reducing effect of compositions for surface treatment A1 to A5 was also confirmed for the SiN substrate. Therefore, from Reference Examples 1 to 5, it was found that the composition for surface treatment of the present invention can also exert the effect of the present invention on the SiN substrate. From this, it was found that the composition for surface treatment of the present invention can be suitably used even when a polished object to be polished contains silicon oxide and silicon nitride.

From these, it is found that when an object to be polished containing silicon oxide is polished using a polishing composition containing cerium oxide abrasive grains or anion-modified colloidal silica abrasive grains as abrasive grains, the residues (abrasive grains, polishing pad) adhering to the polished object to be polished can be sufficiently removed by surface-treating the polished object to be polished using compositions for surface treatment A1 to A6 of the present invention. The above is the results of evaluation immediately after the production of each composition for surface treatment, and when the composition for surface treatment is stored or preserved for a long period of time, the composition for surface treatment preferably contains an antifungal agent (antiseptic agent). The antifungal agent (antiseptic agent) has little or no influence on the above results, and thus it is considered that the composition for surface treatment containing the antifungal agent (antiseptic agent) also has the same results as above.

The present application is based on Japanese Patent Application No. 2021-129173 filed on Aug. 5, 2021 and Japanese Patent Application No. 2022-78423 filed on May 11, 2022, the disclosures of which are incorporated herein by reference in their entirety.

The invention claimed is:

1. A surface treatment method for reducing a residue comprising inorganic oxide abrasive grains on a surface of a polished object to be polished comprising silicon oxide using a composition for surface treatment, wherein;
    the composition for surface treatment comprises a zeta potential adjusting agent having an sp value of more than 9 and 11 or less and having a negatively charged functional group and a dispersing medium,
    the zeta potential adjusting agent is an anionic surfactant having a molecular weight of less than 1,000, and
    the surface treatment method comprises negatively controlling a zeta potential of the silicon oxide and controlling a zeta potential of the inorganic oxide abrasive grains to −30 mV or less using the composition for surface treatment.

2. The surface treatment method according to claim 1, wherein the inorganic oxide abrasive grains comprise cerium oxide abrasive grains, and a zeta potential of the cerium oxide abrasive grains is controlled to −30 mV or less using the composition for surface treatment.

3. The surface treatment method according to claim 1, wherein the residue further comprises polyurethane, and the surface treatment method further comprises controlling a zeta potential of the polyurethane to −30 mV or less using the composition for surface treatment.

4. The surface treatment method according to claim 1, wherein the anionic surfactant has at least one functional group selected from the group consisting of a sulfonic acid (salt) group, a sulfuric acid (salt) group, a phosphonic acid (salt) group, and a phosphoric acid (salt) group.

5. The surface treatment method according to claim 1, wherein the composition for surface treatment further comprises a pH adjusting agent.

6. The surface treatment method according to claim 1, wherein a pH value of the composition for surface treatment is 2 or more and less than 5.

7. The surface treatment method according to claim 1, wherein the surface treatment method is a rinse polishing treatment method or a cleaning treatment method.

8. A method for producing a semiconductor substrate, comprising:
    a polishing step of obtaining a polished semiconductor substrate by polishing a semiconductor substrate before polishing comprising silicon oxide using a polishing composition comprising inorganic oxide abrasive grains, wherein the polished semiconductor substrate is a polished object to be polished; and
    a surface treatment step of reducing a residue comprising the inorganic oxide abrasive grains on a surface of the polished semiconductor substrate by the surface treatment method according to claim 1.

9. The method for producing a semiconductor substrate according to claim 8, wherein the inorganic oxide abrasive grains comprise cerium oxide abrasive grains, and the method comprises controlling a zeta potential of the cerium oxide abrasive grains to −30 mV or less using the composition for surface treatment used in the surface treatment step.

10. The method for producing a semiconductor substrate according to claim 8, wherein
    the polishing step comprises using a polishing pad made of polyurethane,
    the residue further comprises the polyurethane, and
    the method further comprises controlling a zeta potential of the polyurethane to −30 mV or less using the composition for surface treatment used in the surface treatment step.

11. The method for producing a semiconductor substrate according to claim 10, wherein a Shore A hardness of the polishing pad is 40° or more and 100° or less.

12. The surface treatment method according to claim 1, wherein the zeta potential adjusting agent is an anionic surfactant having a molecular weight of more than 500.

13. The surface treatment method according to claim 4, wherein the zeta potential adjusting agent is an anionic surfactant having a molecular weight of more than 500.

* * * * *